(12) United States Patent
Kim et al.

(10) Patent No.: US 9,905,629 B2
(45) Date of Patent: Feb. 27, 2018

(54) DISPLAY DEVICE

(71) Applicant: Samsung Display Co., Ltd., Yongin-si, Gyeonggi-do (KR)

(72) Inventors: Sunkwang Kim, Yongin-si (KR); Kinyeng Kang, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/287,583

(22) Filed: Oct. 6, 2016

(65) Prior Publication Data

US 2017/0288004 A1    Oct. 5, 2017

(30) Foreign Application Priority Data

Apr. 5, 2016   (KR) .......................... 10-2016-0041731

(51) Int. Cl.
| | |
|---|---|
| *H01L 27/32* | (2006.01) |
| *H01L 51/00* | (2006.01) |
| *H01L 51/52* | (2006.01) |
| *H01L 27/12* | (2006.01) |

(52) U.S. Cl.
CPC ...... *H01L 27/3276* (2013.01); *H01L 27/3258* (2013.01); *H01L 51/0096* (2013.01); *H01L 51/5253* (2013.01); *H01L 27/124* (2013.01)

(58) Field of Classification Search
CPC ............. H01L 27/3258; H01L 27/3276; H01L 27/326
See application file for complete search history.

(56) References Cited

U.S. PATENT DOCUMENTS

| | | |
|---|---|---|
| 2015/0014650 A1 | 1/2015 | Lim et al. |
| 2015/0036299 A1 | 2/2015 | Namkung et al. |
| 2016/0233248 A1 | 8/2016 | Kwak et al. |

FOREIGN PATENT DOCUMENTS

| | | |
|---|---|---|
| KR | 10-2014-0086708 A | 7/2014 |
| KR | 10-2015-0015257 A | 2/2015 |
| KR | 10-2015-0016053 A | 2/2015 |
| KR | 10-2016-0097449 A | 8/2016 |

*Primary Examiner* — Amar Movva
(74) *Attorney, Agent, or Firm* — Innovation Counsel LLP

(57) ABSTRACT

A display device includes: a substrate; an insulating layer arranged above the substrate; a through portion configured to pass through the substrate and the insulating layer; a pixel array located above the insulating layer and including pixels each including a light-emitting element including a pixel electrode, an opposite electrode facing the pixel electrode, and an emission layer arranged between the pixel electrode and the opposite electrode, the pixels at least partially surrounding the through portion; and a pattern portion arranged between the through portion and the pixel array, wherein the pattern portion includes: a recess that is concave along a thickness direction of the insulating layer; and a cladding layer arranged above the insulating layer, configured to cover the recess, and including a material different from the insulating layer.

24 Claims, 37 Drawing Sheets

DISPLAY DEVICE

CROSS-REFERENCE TO RELATED APPLICATION

This application claims the benefit of Korean Patent Application No. 10-2016-0041731, filed on Apr. 5, 2016, in the Korean Intellectual Property Office, the disclosure of which is incorporated herein in its entirety by reference.

BACKGROUND

1. Field

One or more embodiments relate to a display device.

2. Description of the Related Art

Recently, the purpose of a display device has become more diversified. Also, a display device has a slim profile and is lightweight, and thus a use range thereof has gradually widened. In particular, recently, a display device is used not only in a monitor and a mobile phone, but also in various types of apparatuses such as clocks, and thus various methods are being actively researched in designing the shapes of display devices.

SUMMARY

One or more embodiments include a display device having a through portion.

Additional aspects will be set forth in part in the description that follows and, in part, will be apparent from the description, or may be learned by practice of the presented embodiments.

According to one or more embodiments, a display device includes: a substrate; an insulating layer arranged above the substrate; a through portion configured to pass through the substrate and the insulating layer; a pixel array located above the insulating layer and including pixels each including a light-emitting element including a pixel electrode, an opposite electrode facing each other, and an emission layer arranged between the pixel electrode and the opposite electrode, the pixels at least partially surrounding the through portion; and a pattern portion arranged between the through portion and the pixel array, wherein the pattern portion includes: a recess that is concave along a thickness direction of the insulating layer; and a cladding layer arranged above the insulating layer, configured to cover the recess, and including a material different from the insulating layer.

The substrate may include a display area in which the pixel array is located and a non-display area adjacent to the display area, and the non-display area may include a first sub-non-display area surrounding an outer edge of the display area and a second sub-non-display area surrounding an outer edge of the through portion between the through portion and the display area.

The pattern portion may be arranged in the second sub-non-display area.

The insulating layer may include an inorganic layer.

The display device may further include: a pixel circuit including a thin film transistor and a storage capacitor, and wherein the insulating layer includes a plurality of inorganic insulating layers, and at least one of the plurality of inorganic insulating layers is arranged between electrodes of the thin film transistor or between electrodes of the storage capacitor to insulate the electrodes.

The recess may have a depth less than or corresponding to a thickness of the insulating layer.

The cladding layer may include an organic material.

The light-emitting element may further include at least one of a first functional layer arranged between the pixel electrode and the emission layer and a second functional layer arranged between the emission layer and the opposite electrode, the cladding layer may include at least one of a first material layer and a second material layer, the first material layer may include an insulating material, and the second material layer may include a same material as at least one of the at least one functional layer and the emission layer.

The cladding layer may include the first material layer, and a portion of the first material layer may be located inside the recess.

The cladding layer may include the second material layer, and a portion of the second material layer may be located inside the recess.

The display device may further include: a metallic pattern located below the recess, an upper surface of the metallic pattern corresponding to a bottom surface of the recess.

The cladding layer may include a stacked body including the first material layer and the second material layer arranged above the first material layer.

The through portion may be a single closed curve.

The recess may have a ring shape surrounding the through portion and having a diameter greater than a diameter of the through portion.

The through portion may extend up to at least one edge of the display device.

The display device may further include: a layer arranged above the cladding layer and including a same material as that of the opposite electrode.

The display device may further include: an encapsulation layer configured to cover the pixel array.

The encapsulation layer may include an inorganic encapsulation layer and an organic encapsulation layer.

The display device may further include: a dam arranged between the pattern portion and the pixel array, an end of the organic encapsulation layer being located between the dam and the pixel array.

The inorganic encapsulation layer may extend toward the through portion and cover the pattern portion.

The inorganic encapsulation layer may directly contact the insulating layer in a region between the through portion and the pattern portion.

The insulating layer may include an auxiliary recess corresponding to a region between the through portion and the pattern portion.

The display device may further include: a step portion having an undercut shape and arranged between the through portion and the pixel array.

The opposite electrode may extend toward the through portion and may be disconnected by the step portion.

According to embodiments, a display device including a through portion inside a display area may prevent crack from occurring or propagating along surroundings of the through portion. As understood by a person of ordinary skill in the art, the scope of the inventive concept is not limited by this effect.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
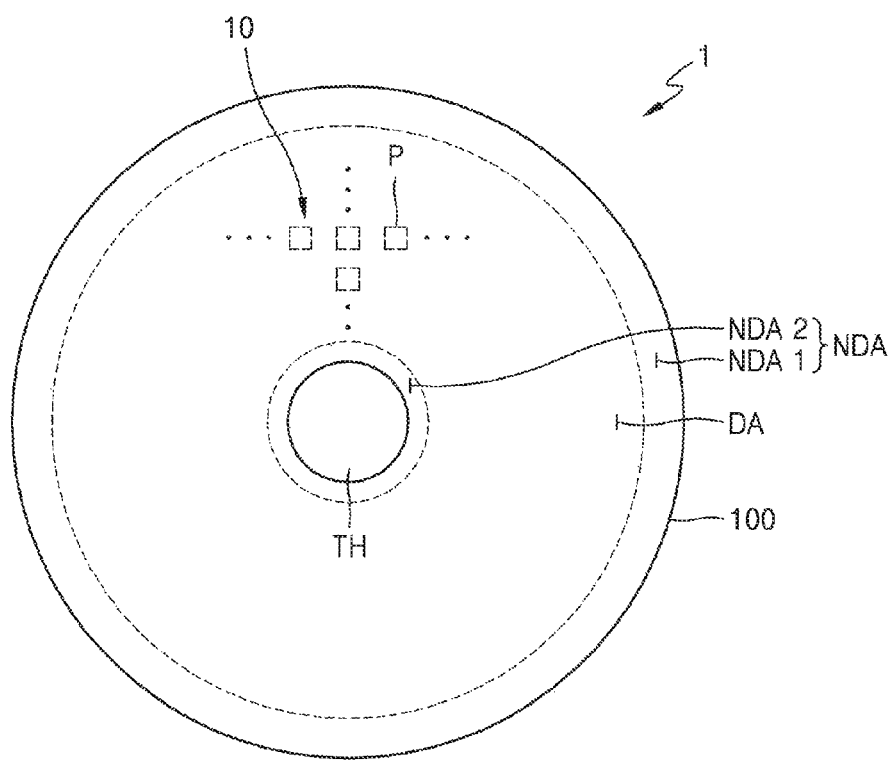
FIG. 1 is a plan view illustrating a display device according to an embodiment.

As the inventive concept allows for various changes and numerous embodiments, exemplary embodiments will be illustrated in the drawings and described in detail in the written description. Effects and characteristics of the inventive concept, and a method of accomplishing them will be apparent with reference to embodiments described below together with the drawings. However, the inventive concept is not limited to the embodiments described below but may be implemented in various forms.

Hereinafter, the inventive concept will be described more fully with reference to the accompanying drawings, in which exemplary embodiments of the inventive concept are shown. When description is made with reference to the drawings, like reference numerals in the drawings denote like or corresponding elements, and repeated description thereof will be omitted.

As used herein, the term "and/or" includes any and all combinations of one or more of the associated listed items.

It will be understood that although the terms "first", "second", etc. may be used herein to describe various components, these components are not limited by these terms. These components are only used to distinguish one component from another.

As used herein, the singular forms "a" "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

FIG. 1 is a plan view illustrating a display device 1 according to an embodiment.

Referring to FIG. 1, the display device 1 includes a substrate 100 and a pixel array 10 above the substrate 100.

The substrate 100 may include a material such as glass, metal, or an organic material. According to an embodiment, the substrate 100 may include a flexible material. For example, the substrate 100 may include a material such as polyimide (PI), which may be readily bent and crooked or rolled, but this is mere exemplary, and an embodiment is not limited thereto.

The substrate 100 includes a display area DA and a non-display area NDA. A through portion TH is located in the display area DA. The through portion TH is a hole passing through the substrate 100, an encapsulation layer 400, and layers arranged therebetween and is located inside the display area DA and surrounded by the pixel array 10 including a plurality of pixels P.

Each pixel P of the pixel array 10 includes a pixel circuit and a light-emitting element, for example, an organic light-emitting diode (OLED), electrically connected to the pixel circuit and provides a predetermined image by using light emitted from the light-emitting element. The pixel array 10 is sealed by an encapsulation layer described below. The encapsulation layer may be a multi-layer including a layer including an organic material and a layer including an inorganic material.

The non-display area NDA is a region that does not provide an image and includes a first sub-non-display area NDA1 surrounding an outer edge of the display area DA and a second sub-non-display area NDA2 surrounding an outer edge of a through portion TH.

The first non-display area NDA1 may include a scan driver (not shown) and a data driver (not shown) for transferring a predetermined signal to each pixel PX of the display area DA. The second non-display area NDA2 is arranged between the through portion TH and the display area DA.

Though FIG. 1 illustrates that the through portion TH is located in the center of the display area DA of the display device 1, an embodiment is not limited thereto. The through portion TH may be surrounded by pixels P and located in any location of the display area DA, and a specific location of the through portion TH is not limited.

Though FIG. 1 illustrates that the through portion TH is circular and one through portion TH is formed, an embodiment is not limited thereto. The through portion TH may have various shapes such as a polygonal shape including a quadrangular shape or an elliptical shape. One or more through portions TH may be formed.

Though FIG. 1 illustrates that the display area DA is circular, an embodiment is not limited thereto. The display area DA may have various shapes such as a polygonal shape including a quadrangular shape or an elliptical shape.

Figure 2:
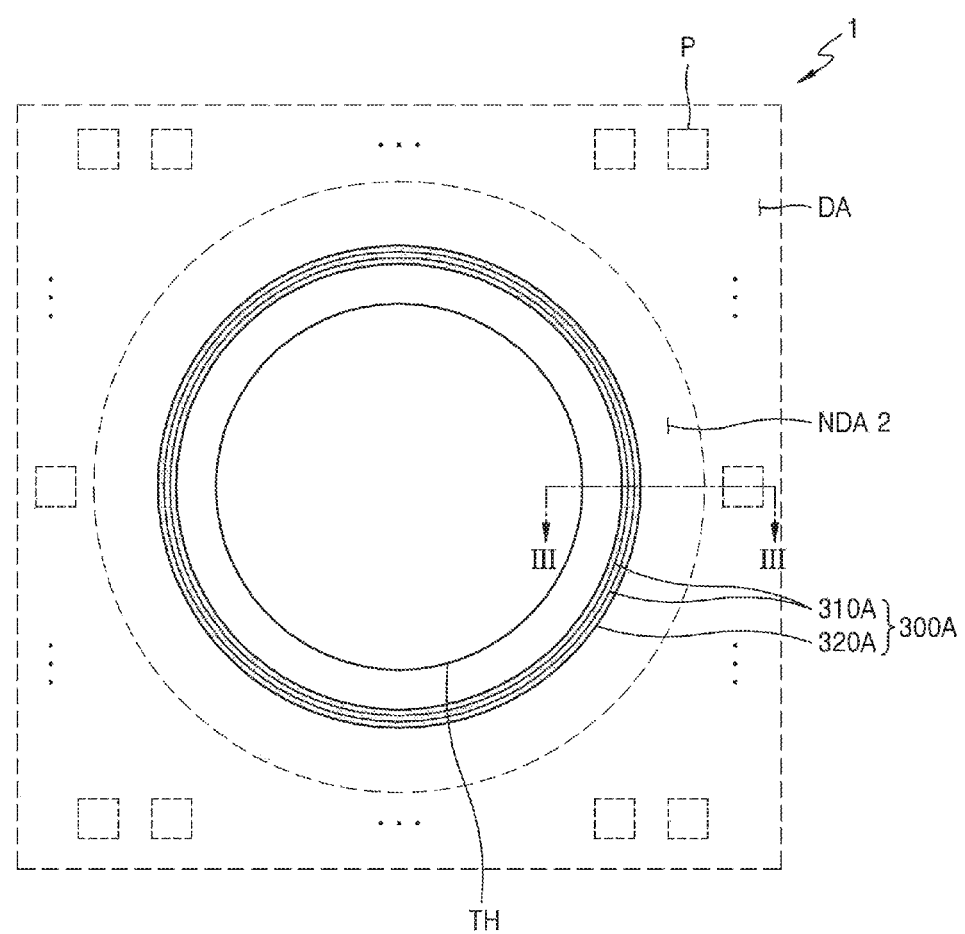
FIG. 2 is a plan view magnifying a display area around a through portion of FIG. 1.
Figure 3:
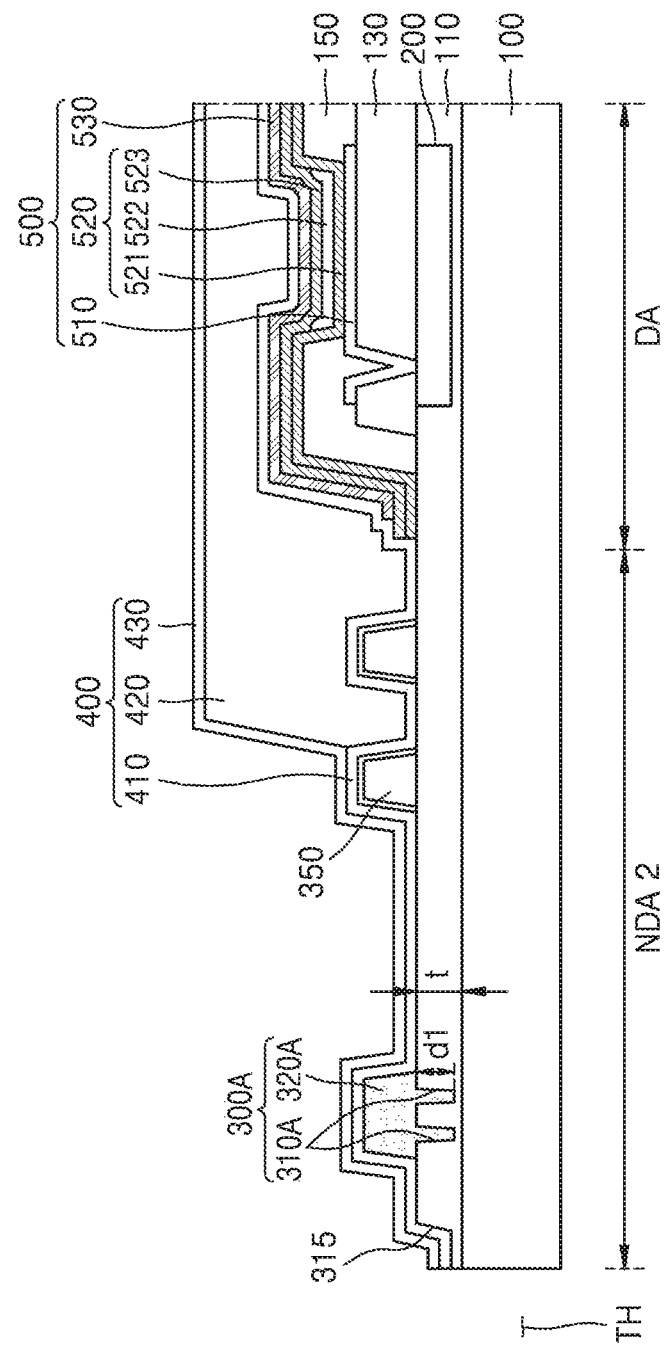
FIG. 3 is a cross-sectional view taken along a line III-III of FIG. 2.

FIG. 2 is a plan view magnifying a display area around a through portion of FIG. 1, and FIG. 3 is a cross-sectional view taken along a line III-III of FIG. 2.

Referring to FIGS. 2 and 3, the through portion TH is surrounded by pixels P, and a region in which a pixel P is not provided, that is, a second non-display area NDA2, is located between the through portion TH and the pixels P.

The through portion TH may pass through the substrate 100, the encapsulation layer 400, and layers arranged therebetween. The through portion TH may be formed via cutting/punching equipment using a laser, etc. However, a crack may occur in the neighborhood of the through portion TH due to impulse during a process of forming the through portion TH by using the cutting equipment. To prevent the crack from propagating toward the pixels P, a pattern portion 300A is arranged in the second sub-non-display area NDA2.

The pattern portion 300A includes a recess 310A and a cladding layer 320A covering the recess 310A. The recess 310A has a ring shape having a radius greater than a radius of the through portion TH and surrounds an outer edge of the through portion TH as illustrated in FIG. 2.

Though FIG. 2 illustrates a case in which the through portion TH has a circular shape and the recess 310A has a circular ring shape, an embodiment is not limited thereto. The recess 310A may have a polygonal ring shape such as a triangular ring shape and a quadrangular ring shape, or an elliptical ring shape.

The recess 310A is a kind of a groove concave along a thickness direction of the insulating layer 110 located above the substrate 100 and may prevent a crack from propagating toward the display area DA. A depth "d1" of the recess 310A may have a depth less than or corresponding to a thickness "t" of the insulating layer 110. In an embodiment, the depth "d1" of the recess 310A may be about 6000 Å to about 8000 Å.

The insulating layer 110 including the recess 310A may include an inorganic layer and include a single inorganic layer or a plurality of inorganic layers. For example, the insulating layer 110 may include an inorganic material such as a silicon oxide, a silicon nitride, and a silicon oxynitride.

The cladding layer 320A overlaps the recess 310A to cover the recess 310A. The cladding layer 320A is arranged right above the insulating layer 110 including the recess 310A to directly contact the recess 310A, and a portion of the cladding layer 320A may be arranged inside the recess 310A.

The cladding layer 320A may include an organic insulating material. For example, the cladding layer 320A may include the same material as that of a via insulating layer 130 and/or a pixel-defining layer 150 described below.

The cladding layer 320A may provide a relatively flat upper surface while covering the recess 310A. The entire thickness of the cladding layer 320A, that is, a thickness from the bottom to the upper surface of the cladding layer 320A filling the recess 310A may be about 7000 Å to 15000 Å, but an embodiment is not limited thereto.

The cladding layer 320A prevents a crack from propagating by reducing stress of a portion in which the recess 310A is formed from among the insulating layer 110 which is an inorganic layer. Also, the cladding layer 320A may prevent particles generated during a manufacturing process from being stored in the recess 310A and then moving to a light-emitting element 500 of a pixel P to induce a dark spot by covering the recess 310A.

Referring to FIG. 3, an auxiliary recess 315 may be arranged between the through portion TH and the pattern portion 300A. The auxiliary recess 315 is a kind of a groove concave along a thickness direction of the insulating layer 110 and may be simultaneously formed during the same process while the recess 310A is formed. The depth of the auxiliary recess 315 may be substantially the same as the depth of the recess 310A.

The auxiliary recess 315 may be located at the end of the insulating layer 110 adjacent to the through portion TH and spatially connected to the through portion TH. Like the pattern portion 300A, the auxiliary recess 315 may prevent a crack induced by impulse generated during a process of forming the through portion TH from propagating toward a pixel P.

Inorganic encapsulation layers 410 and 430 included in the encapsulation layer 400 cover the pattern portion 300A and the auxiliary recess 315. Since the insulating layer 110, which is an inorganic layer, contacts the inorganic encapsulation layers 410 and 430 in an edge region of the second sub-non-display area NDA2 adjacent to the through portion TH, that is, in a region between the pattern portion 300A and the through portion TH, penetration of external oxygen or moisture via an interface between the insulating layer 110, which is an inorganic layer, and the inorganic encapsulation layers 410 and 430 in a lateral direction may be prevented, so that a sealing characteristic improves.

The encapsulation layer 400 includes the inorganic encapsulation layers 410 and 430 and an organic encapsulation layer 420. For example, the encapsulation layer 400 may be formed by sequentially stacking the inorganic encapsulation layer 410, the organic encapsulation layer 420, and the inorganic encapsulation layer 430. The inorganic encapsulation layers 410 and 430 may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cesium oxide, and a silicon oxynitride. The inorganic encapsulation layers 410 and 430 may be formed by, for example, a chemical vapor deposition (CVD) process.

The organic encapsulation layer 420 may include at least one of an acryl-based resin, a methacrylic-based resin, a polyisoprene, a vinyl-based resin, an epoxy-based resin, a urethane-based resin, a cellulose-based resin, and a perylene-based resin.

In an embodiment, the organic encapsulation layer 420 may be formed by an atomic layer deposition (ALD) process that uses a material such as hexamethyldisiloxane (HMDSO) or tetraethyl orthosilicate (TEOS) as a raw material.

In another embodiment, the organic encapsulation layer 420 may be formed by depositing liquid monomer and then curing the monomer by using heat or light such as an ultraviolet ray. Here, to prevent the liquid monomer from flowing toward the pattern portion 300A and an edge tail of the organic encapsulation layer 420 from being formed, a dam 350 may be arranged in the second sub non-display area NDA2. The end of the organic encapsulation layer 420 is located between the dam 350 and the pixel P by the dam 350.

Though a case in which the encapsulation layer 400 includes the two inorganic encapsulation layers 410 and 430 and one organic encapsulation layer 420 has been described, a stacking sequence and a number of the inorganic encapsulation layers and the organic encapsulation layers are not limited thereto.

A pixel circuit 200 and a light-emitting element 500 are located in the display area DA.

The light-emitting element 500 includes a pixel electrode 510 electrically connected to the pixel circuit 200 with a via insulating layer 130 including a via hole arranged therebetween, an opposite electrode 530 facing the pixel electrode 510, and an intermediate layer 520 arranged between the pixel electrode 510 and the opposite electrode 530. In an embodiment, the via insulating layer 130 may include an insulating organic material.

The pixel electrode 510 is exposed via an opening formed in the pixel-defining layer 150. The pixel-defining layer 150 including an insulating organic material may cover the edge of the pixel electrode 510. In an embodiment, the pixel electrode 510 may include Ag, Mg, Al, Pt, Pd, Au, Ni, Nd, Ir, Cr, or a compound thereof.

The opposite electrode 530 may be integrally formed and may entirely cover the display area DA. In an embodiment, the opposite electrode 530 may include a thin film metallic layer containing Ag and Mg, or a transparent conductive oxide (TCO) layer including an indium tin oxide (ITO), an indium zinc oxide (IZO), a zinc oxide (ZnO), indium oxide ($In_2O_3$), an indium gallium oxide (IGO), or an aluminum zinc oxide (AZO).

The intermediate layer 520 includes an emission layer 522. The emission layer 522 may include an organic material including a fluorescent or phosphorescent material emitting red, green, and blue light and may be patterned to correspond to a pixel P in the display area DA. The intermediate layer 520 may include at least one of a first functional layer 521 arranged between the emission layer 522 and the pixel electrode 510, and a second functional layer 523 arranged between the emission layer 522 and the opposite electrode 530.

The first functional layer 521 may include at least one of a hole injection layer (HIL) and a hole transparent layer (HTL). The HIL allows a hole to be easily emitted from an anode, and the HTL allows a hole of the HIL to be transferred up to the emission layer.

The HIL may include a phthalocyanine compound such as copper phthalocyanine, DNTPD (N,N'-diphenyl-N,N'-bis-[4-(phenyl-m-tolyl-amino)-phenyl]-biphenyl-4,4'-diamine, m-MTDATA(4,4',4"-tris(3-methylphenylphenylamino) triphenylamine, TDATA(4,4'4"-Tris(N, N-diphenylamino)triphenylamine, 2T-NATA(4,4',4"-tris{N,-(2-naphthyl)-N-phenylamino}-triphenylamine, PEDOT/PSS(Poly(3,4-ethylenedioxythiophene)/Poly(4-styrenesulfonate), Pani/DBSA(Polyaniline/Dodecylbenzenesulfonic acid,), Pani/CSA(Polyaniline/Camphor sulfonicacid,) or PANI/PSS (Polyaniline)/Poly(4-styrenesulfonate) or Polyaniline/poly (4-styrene sulfonate)), but is not limited thereto.

The HTL may include carbazole derivatives such as N-phenyl carbazole, polyvinyl carbazole, and a triphenylamine-based material such as TPD(N,N'-bis(3-methylphenyl)-N,N'-diphenyl-[1,1-biphenyl]-4,4'-diamine, NPB (N,N'-di(1-naphthyl)-N,N'-diphenylbenzidine), TCTA(4,4', 4"-tris(N-carbazolyl)triphenylamine), but is not limited thereto.

The second functional layer 523 may include at least one of an electron transport layer (ETL) and an electron injection layer (EIL). The EIL allows an electron to be easily emitted from a cathode, and the ETL allows an electron of the EIL to be transferred up to the emission layer.

The ETL may include Alq3, BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole, NTAZ(4-(Naphthalen-1-yl)-3,5-diphenyl-4H-1,2,4-triazole, tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum, Bebq2(beryllium bis(benzoquinolin-10-olate), ADN(9,10-di (naphthalene-2-yl)anthrascene), and is not limited thereto.

The EIL may include a material such as LiF, NaCl, CsF, $Li_2O$, BaO, Liq, but is not limited thereto.

The ends of the first functional layer 521 and the second functional layer 523 arranged in the display area DA are spaced apart from the pattern portion 300A. During a process of manufacturing the display device 1, the first and second functional layers 521 and 523 are formed to cover not only the display area DA but also the second sub-non-display area NDA2 surrounding the through portion TH, and then a portion of the first and second functional layers 521 and 523 that corresponds to the second sub-non-display area NDA2 may be removed before the encapsulation layer 400 is formed. In an embodiment, the first and second functional layers 521 and 523 may be removed by using laser etching.

In a comparison example, if the first and second functional layers 521 and 523 cover both the display area DA and the second sub non-display area NDA2, the insulating layer 110, which is an inorganic layer, and the inorganic encapsulation layer 410 do not directly contact each other in a region adjacent to the through portion TH. That is, the first and second functional layers 521 and 523 would be arranged between the insulating layer 110 and the inorganic encapsulation layer 410, which provides a path through which moisture or oxygen penetrates in a lateral direction. However, according to an embodiment, since the inorganic insulating layer 110 and the inorganic encapsulation layer 410 having an excellent moisture or oxygen barrier function directly contact each other, a sealing characteristic may improve.

Figure 4:
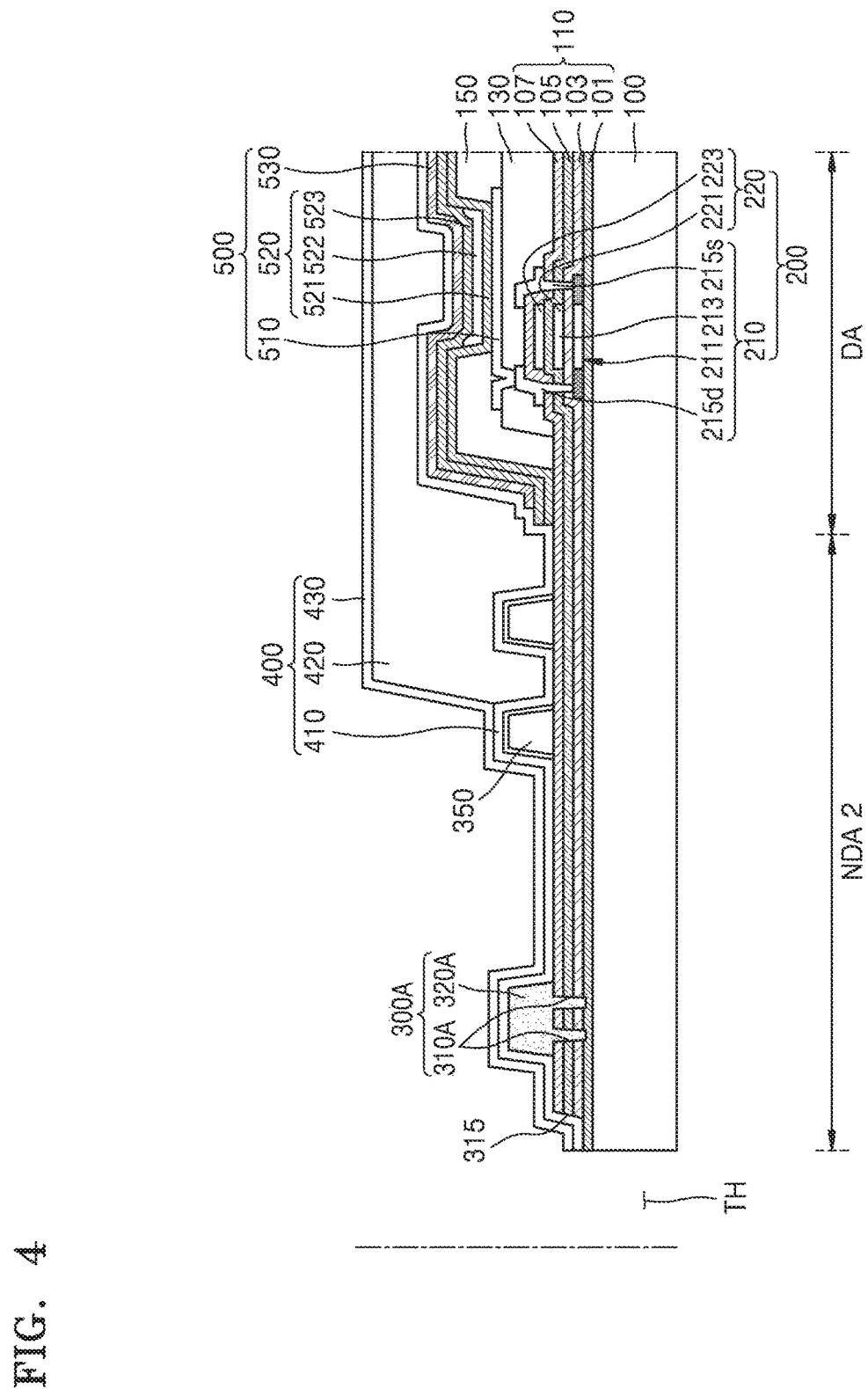
FIGS. 4 and 5 are partial cross-sectional views illustrating a portion of a display area and a second sub-non-display area of a display device according to an embodiment.
Figure 5:
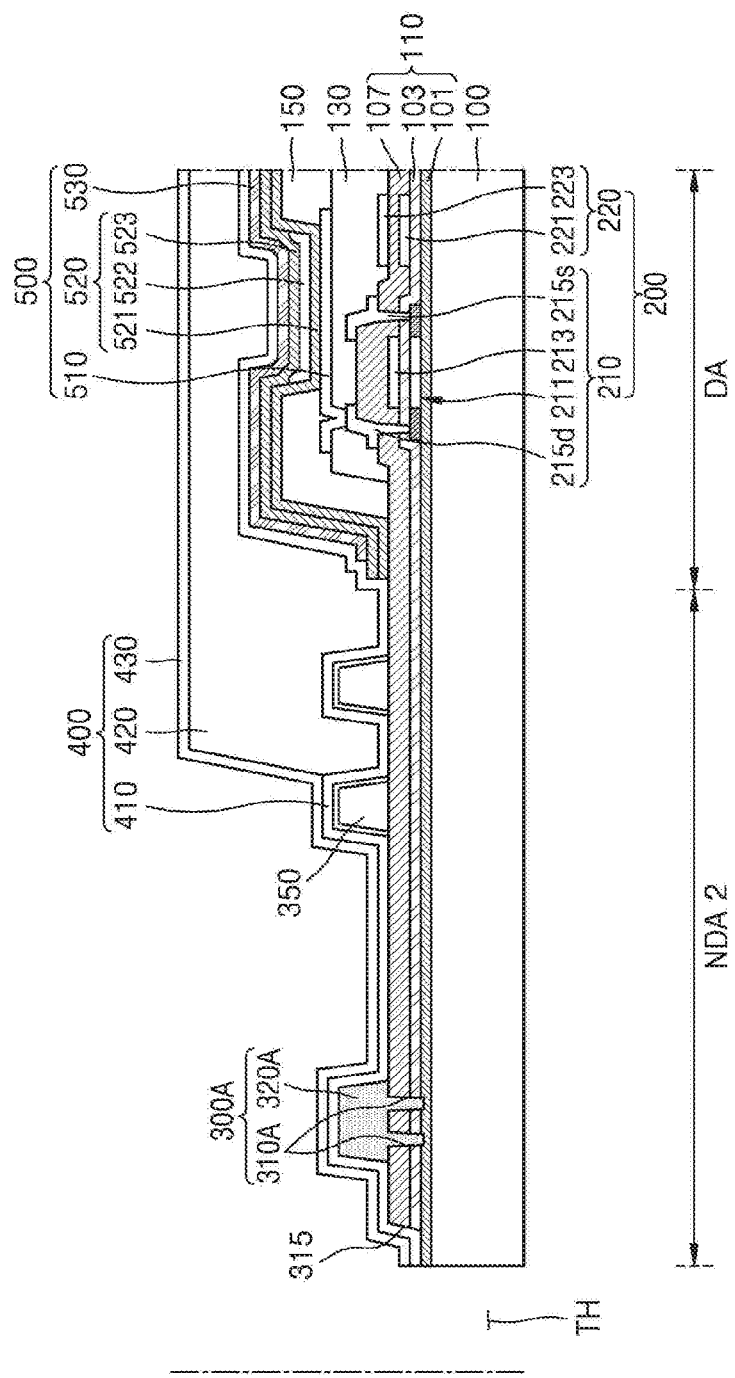

FIGS. 4 and 5 are cross-sectional views extracting a portion of a display area and a second sub-non-display area of a display device according to an embodiment. Since the display device of FIGS. 4 and 5 includes the same configuration as the display device described with reference to FIG. 3, a pixel circuit 200 and an insulating layer 110 are mainly described below.

Referring to FIG. 4, the pixel circuit 200 includes a thin film transistor (TFT) 210 and a storage capacitor 220. The insulating layer 110 may include a buffer layer 101, a gate insulating layer 103, a dielectric insulating layer 105, and an interlayer insulating layer 107 sequentially located above the substrate 100.

The buffer layer 101 is arranged above the substrate 100 and prevents penetration of impurities, the gate insulating layer 103 is arranged between a semiconductor layer 211 and a gate electrode 213 of the TFT 210, the dielectric insulating layer 105 is arranged between a lower electrode 221 and an upper electrode 223 of the storage capacitor 220, and the interlayer insulating layer 107 is arranged between the gate electrode 213, a source electrode 215s and a drain electrode 215d of the TFT 210.

All of the buffer layer 101, the gate insulating layer 103, the dielectric insulating layer 105, and the interlayer insulating layer 107 include an insulating inorganic material. For example, each of the buffer layer 101, the gate insulating layer 103, the dielectric insulating layer 105, and the interlayer insulating layer 107 may include a silicon nitride, a silicon oxide, and/or a silicon oxynitride.

A recess 310A of the pattern portion 300A is concave along a thickness direction of the insulating layer 110. Referring to FIG. 4, the recess 310A may be formed by etching the interlayer insulating layer 107, the dielectric insulating layer 105, the gate insulating layer 103, and the buffer layer 101 until a portion of the buffer layer 101 is exposed. An etching process for forming the recess 310A may be dry etching and may be simultaneously performed during a process of forming contact holes for connecting the semiconductor layer 211 to the source electrode 215s and the drain electrode 215d of the TFT 210.

Though FIG. 4 illustrates a case in which the TFT 210 overlaps the storage capacitor 220, and thus, the gate electrode 213 of the TFT 210 serves as the lower electrode 221 of the storage capacitor 220, an embodiment is not limited thereto.

Referring to FIG. 5, the TFT 210 and the storage capacitor 220 of the pixel circuit 200 may be respectively arranged in different locations.

According to the structure of the pixel circuit 200, the insulating layer 110 may include the buffer layer 101, the gate insulating layer 103, and the interlayer insulating layer 107 sequentially located above the substrate 100. As illustrated in FIG. 5, the interlayer insulating layer 107 is arranged between the lower electrode 221 and the upper electrode 223 of the storage capacitor 220 and performs a function as a dielectric.

The recess 310A of the pattern portion 300A may be formed by etching the interlayer insulating layer 107, the gate insulating layer 103, and the buffer layer 101 until a portion of the buffer layer 101 is exposed. An etching process for forming the recess 310A may be dry etching and may be simultaneously performed during a process of forming contact holes for connecting the semiconductor layer 211 to the source electrode 215s and the drain electrode 215d of the TFT 210.

Though FIGS. 4 and 5 illustrate cases in which the TFT 210 of the pixel circuit 200 is a top-gate type TFT, an embodiment is not limited thereto. In another embodiment, the TFT 210 may be a bottom-gate type TFT. Also, though FIG. 5 illustrates a case in which the lower electrode 221 and the upper electrode 223 of the storage capacitor 220 are located in the same layers as those in which the gate electrode 213, the source electrode 215s, and the drain electrode 215d are arranged, and include the same material as those of the gate electrode 213, the source electrode 215s, and the drain electrode 215d, an embodiment is not limited thereto and may change variously.

Figure 6:
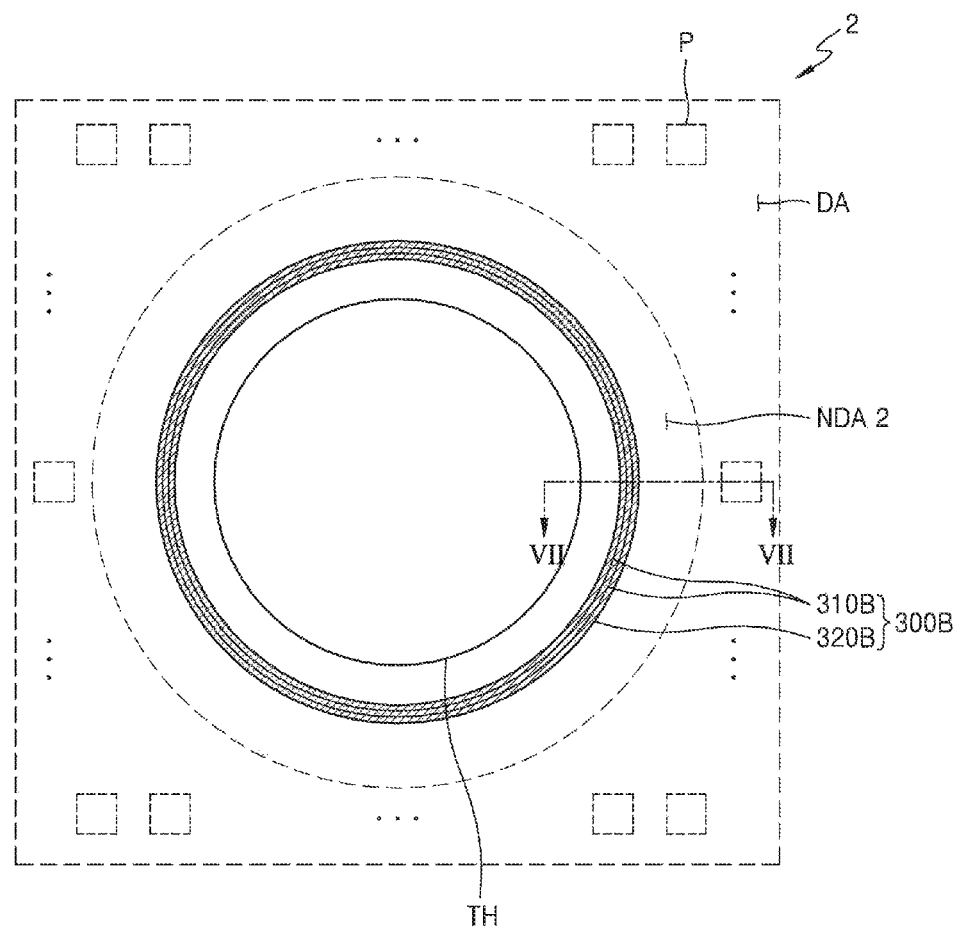
FIG. 6 is a plan view magnifying a display area around a through portion in a display device according to another embodiment.
Figure 7:
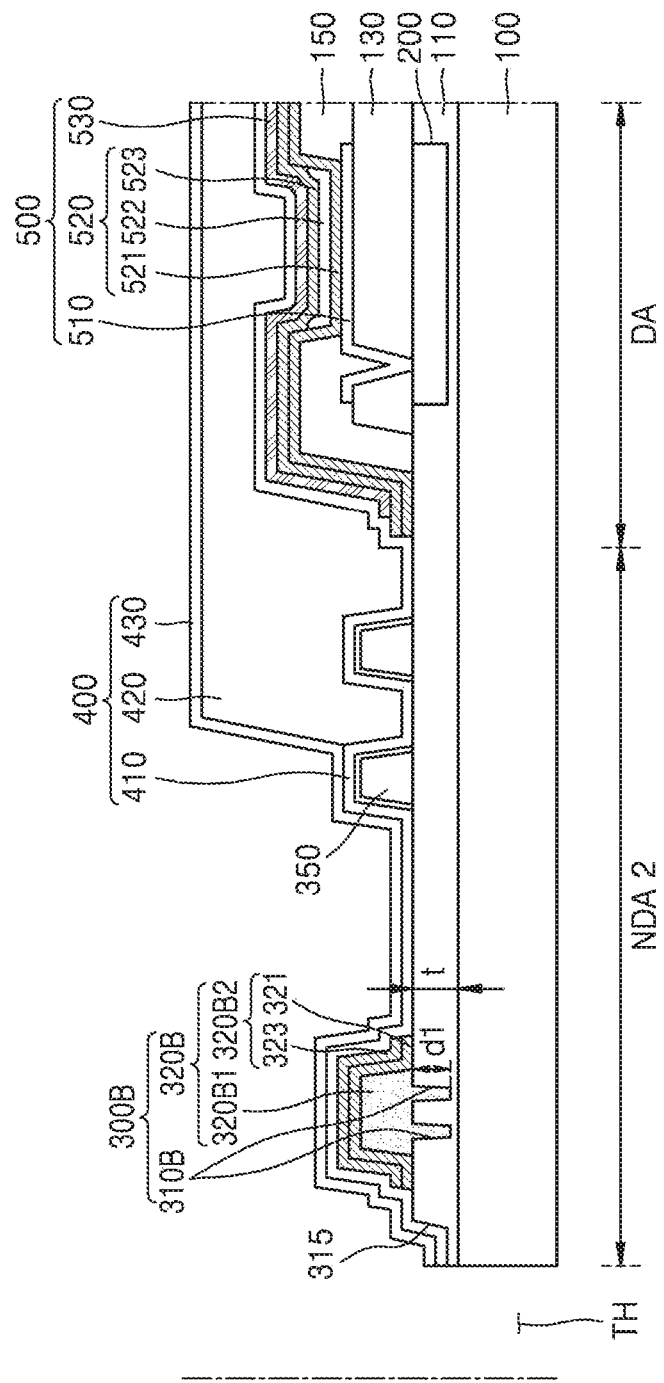
FIG. 7 is a cross-sectional view taken along a line VII-VII of FIG. 6.
Figure 8:
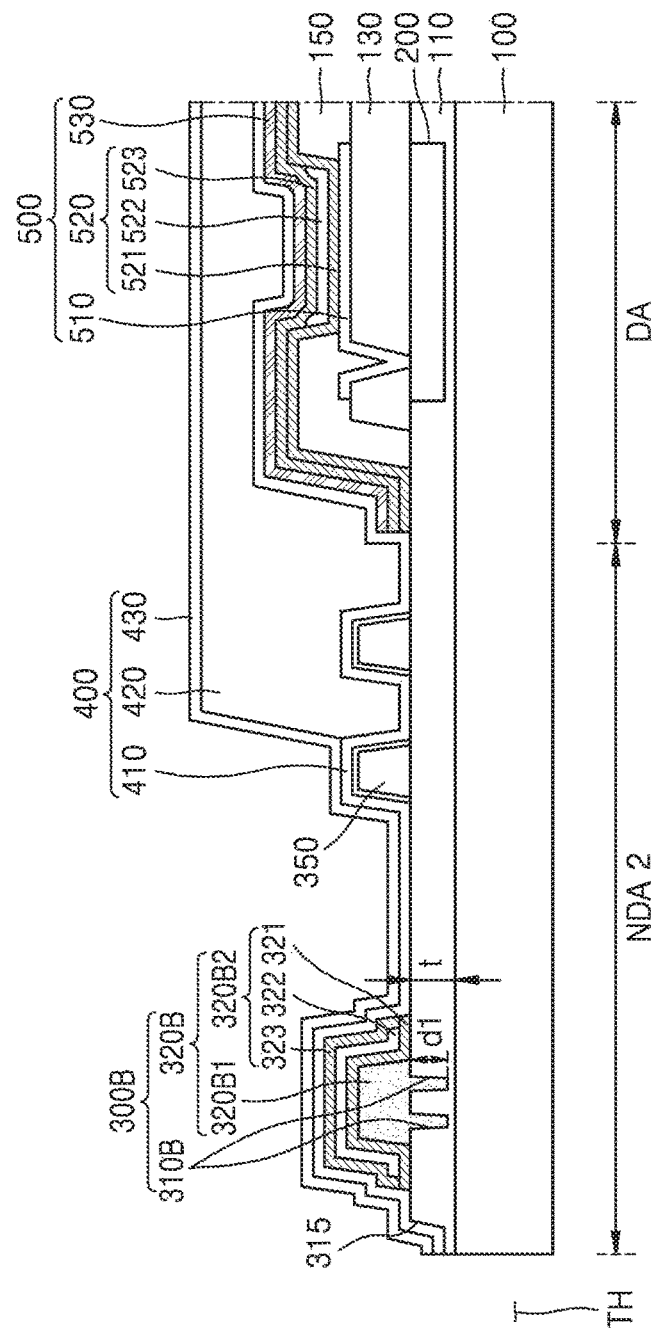
FIGS. 8, 9 and 10 are views illustrating modified embodiments of FIG. 7.
Figure 9:
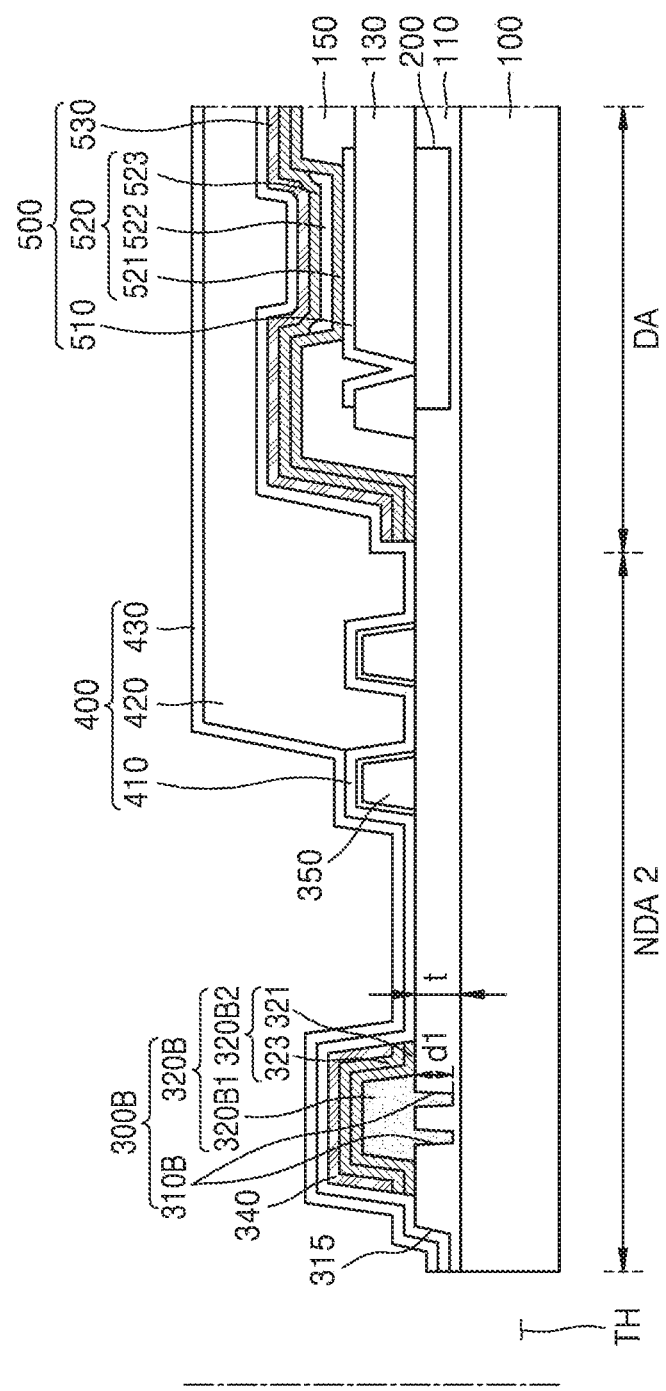
Figure 10:
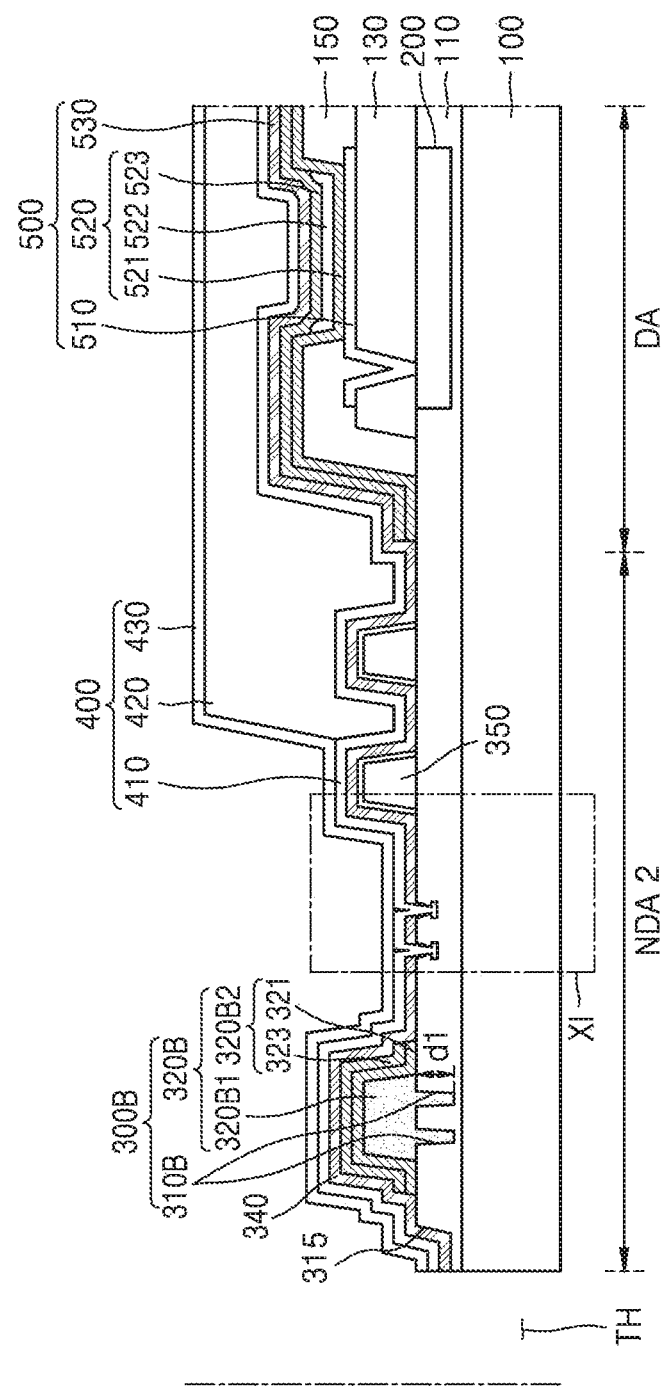
Figure 11:
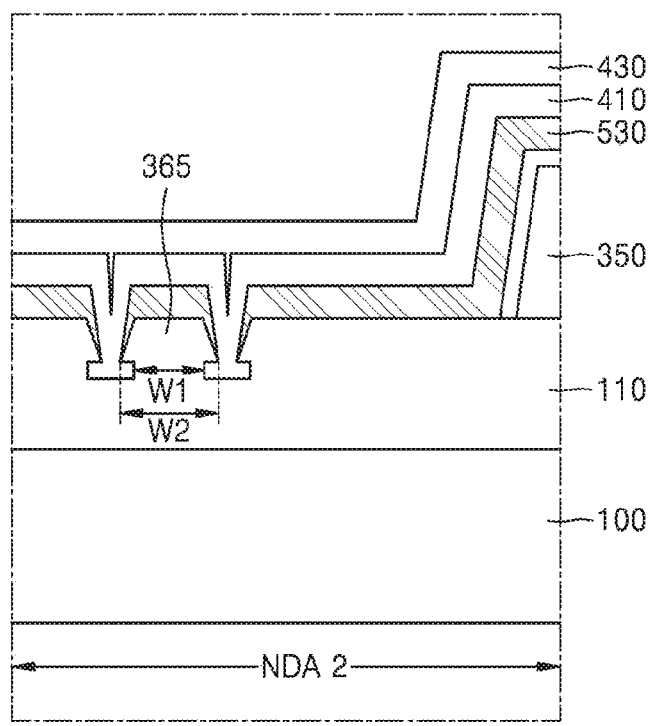
FIG. 11 is a magnified view illustrating a portion XI of FIG. 10.
Figure 12A:
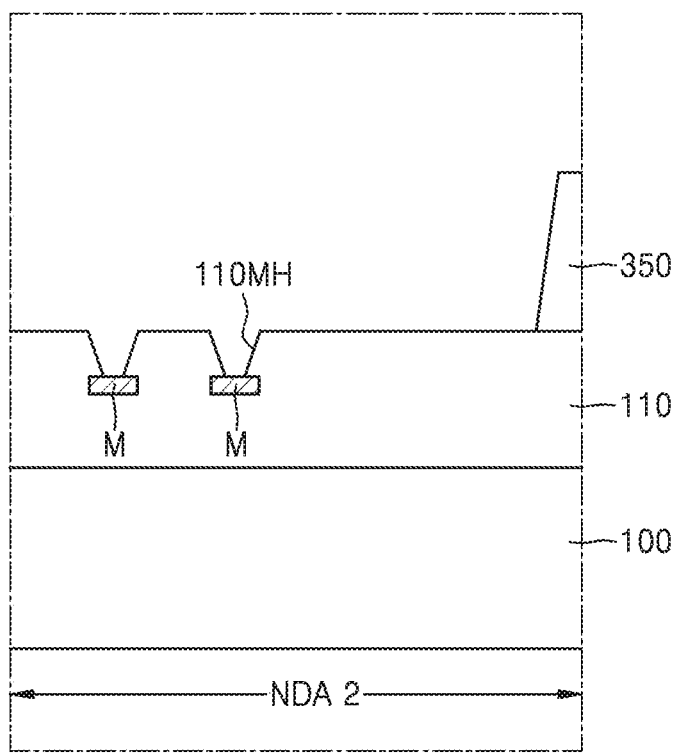
FIGS. 12A, 12B and 12C are cross-sectional views illustrating a manufacturing method of FIG. 10 according to an embodiment.
Figure 12B:
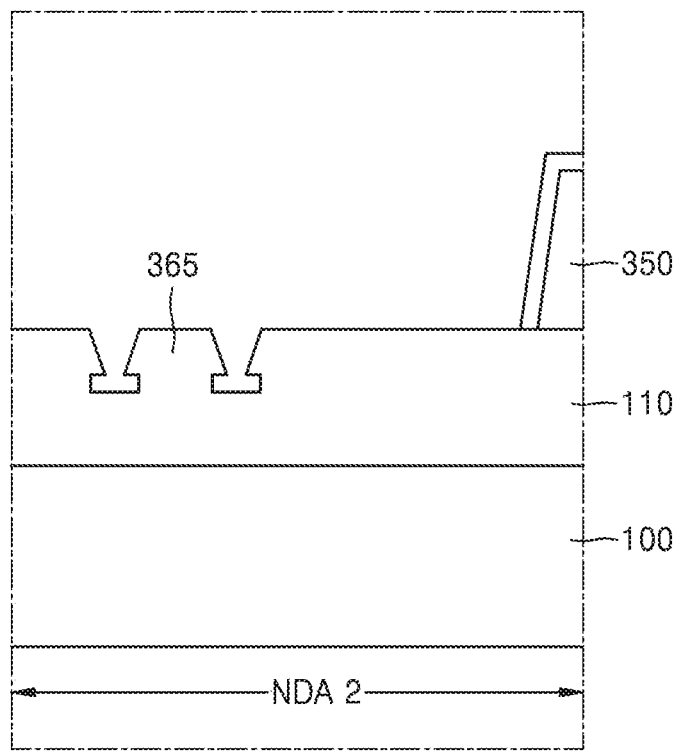
Figure 12C:
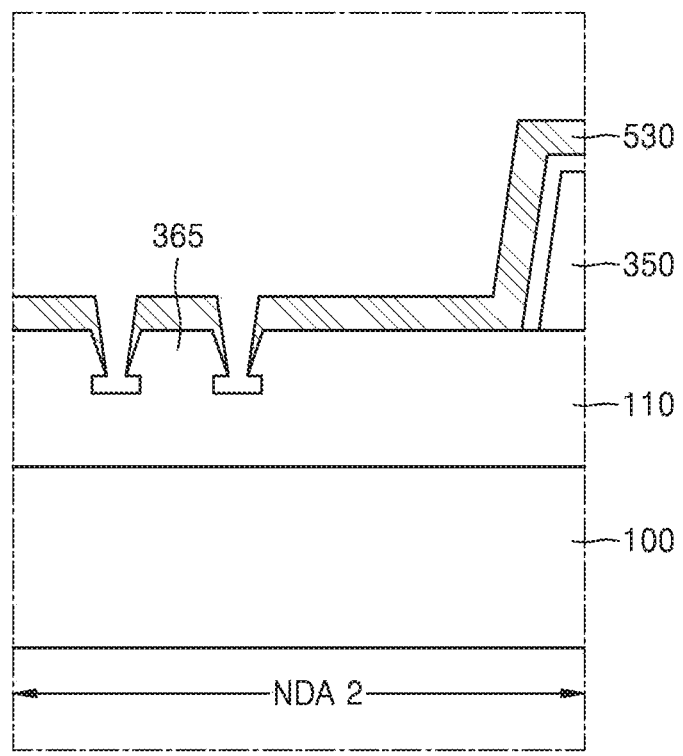
Figure 13:
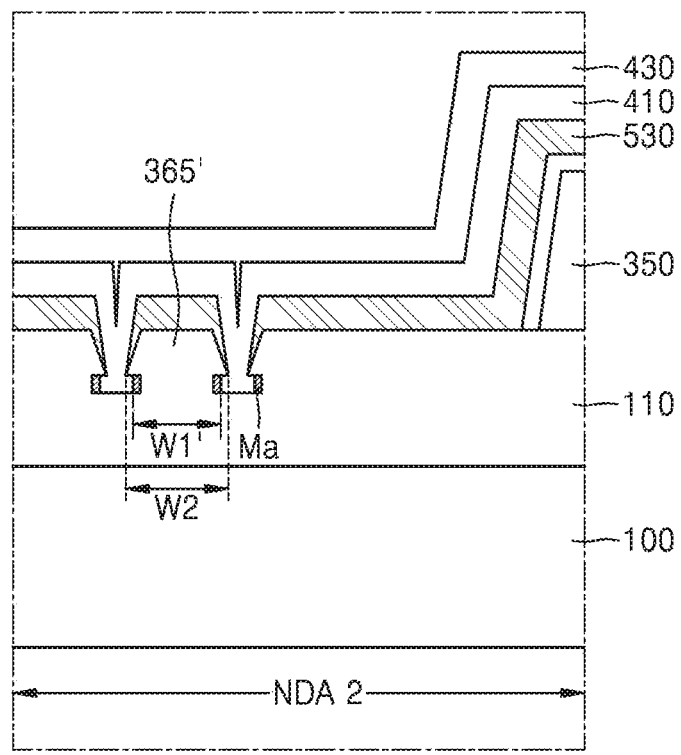
FIG. 13 is a view illustrating a modified embodiment of FIG. 10.

FIG. 6 is a plan view magnifying a display area around a through portion in a display device 2 according to another embodiment, FIG. 7 is a cross-sectional view taken along a line VII-VII of FIG. 6, FIGS. 8 to 10 are views illustrating modified embodiments of FIG. 7, FIG. 11 is a magnified view illustrating a portion XI of FIG. 10, FIGS. 12A to 12C are cross-sectional views illustrating a manufacturing method of FIG. 10 according to an embodiment, and FIG. 13 is a view illustrating a modified embodiment of FIG. 10.

Since the display device 2 illustrated in FIGS. 6 and 7 has substantially the same structure and configuration as those of the display device 1 described above with reference to FIGS. 1 and 2, differences are mainly described below.

Referring to FIGS. 6 and 7, a pattern portion 300B includes a recess 310B and a cladding layer 320B covering the recess 310B, and the cladding layer 320B includes a first material layer 320B1 and a second material layer 320B2. Since the recess 310B of the pattern portion 300B is the same as the recess 310A described above with reference to FIGS. 2 and 3, description thereof is omitted.

The first material layer 320B1 overlaps the recess 310B and covers the recess 310B. The first material layer 320B1 may be arranged right on the insulating layer 110 including the recess 310B to directly contact the recess 310B, and a portion of the first material layer 320B1 may be arranged inside the recess 310A.

Like the cladding layer 320A described above with reference to FIGS. 2 and 3, the first material layer 320B1 is an insulating material layer including an insulating organic material. For example, the first material layer 320B1 may include the same material as that of the via insulating layer 130 and/or the pixel-defining layer 150.

The second material layer 320B2 includes the same material as that of at least one of the first functional layer 521, the emission layer 522, and the second functional layer 523. Since the first and second functional layers 521 and 523 are layers for injection and movement of a hole and an electron and thus have conductivity, the second material layer 320B2 including the same material as those of the first and second functional layers 521 and 523 may include a conductive material.

In an embodiment, as illustrated in FIG. 7, the second material layer 320B2 may have a multi-layered structure including the same material as those of the first and second functional layers 521 and 523. In another embodiment, the second material layer 320B2 may be a single layer 321 including the same material as that of the first functional layer 521, or may be a single layer 323 including the same material as that of the second functional layer 523.

In another embodiment, as illustrated in FIG. 8, the second material layer 320B2 may further include a layer 322 having the same material as that of the emission layer 522. Alternatively, the second material layer 320B2 may be a multi-layer 321 and 322 including the same material as those of the first functional layer 521 and the emission layer 522, or may be a multi-layer 322 and 323 including the same material as those of the second functional layer 523 and the emission layer 522. In another embodiment, the second material layer 320B2 may be a single layer 322 including the same material as that of the emission layer 522.

For convenience of description, a case in which the second material layer 320B2 has a multi-layered structure including the same material as those of the first and second functional layers 521 and 523 is described below.

The second material layer 320B2 may be formed during a process of removing the first and second functional layers 521 and 523 formed in the second sub-non-display area NDA2 of the substrate 100. For example, during a process of manufacturing the display device 2, the first and second functional layers 521 and 523 may be formed to cover not only the display area DA but also the second sub-non-display area NDA2 surrounding the through portion TH, and a portion of the first and the second functional layers 521 and 523 corresponding to the second sub-non-display area NDA2 may be removed via laser etching before the encapsulation layer 400 is formed. The second material layer 320B2 may be formed by leaving a portion of the first and the second functional layers 521 and 523 overlapping the first material layer 320B1 when removing the portion corresponding to the second sub-non-display area NDA2.

As described above with reference to FIG. 3, when the portion of the first and second functional layers 521 and 523 corresponding to the second sub-non-display area NDA2 is removed via the laser etching, a portion of the first material layer 320B1 may be evaporated by the energy of a laser beam. In this case, a flatness of the upper surface of the first material layer 320B1 and a flatness of the upper surface of the second material layer 320B2 arranged above the first material layer 320B1 may deteriorate. If the flatness of the upper surface of the pattern portion 300B deteriorates, a crack generation possibility of the inorganic encapsulation layers 410 and 430 may increase.

However, according to an embodiment, since the display device 2 includes the pattern portion 300 including the second material layer 320B2 formed while the first and second functional layers 521 and 523 above the first material layer 320B1 are not removed, a crack generation possibility and a crack propagation possibility of the inorganic encapsulation layers 410 and 430 may reduce.

The opposite electrode 530 integrally covers the display area DA. In an embodiment, when a material masking the second sub-non-display area NDA2 is formed before the opposite electrode 530 is formed, the opposite electrode 530 is formed to cover the display area DA and the second sub-non-display area NDA2, and then the masking material is removed, the opposite electrode 530 does not remain above the second sub-non-display area NDA2 as illustrated in FIG. 7.

In another embodiment, in the case in which the above-described masking material is not formed, and the opposite electrode 530 is formed to cover the display area DA and the second sub-non-display area NDA2, the opposite electrode 530 may be removed simultaneously when the first and second functional layers 521 and 523 are moved by using laser etching. In this case, since the portion corresponding to the pattern portion 300B is not laser-etched as described above with reference to FIG. 7, a layer 340 including the same material as that of the opposite electrode 530 may be further formed above the pattern portion 300B as illustrated in FIG. 9.

According to another embodiment, the opposite electrode 530 may be formed after the laser etching process. In this case, as illustrated in FIG. 10, the opposite electrode 530 may cover the second sub-non-display area NDA2 and may be integrally connected to the layer 340.

Referring to FIGS. 10 and 11, the opposite electrode 530 may be disconnected by a step portion 365 having an undercut shape in the second sub-non-display area NDA2. The step portion 365 has the undercut shape in which a lower width W1 is less than an upper width W2. The step portion 365 may be formed by using a process described below with reference to FIGS. 12A to 12C.

Referring to FIG. 12A, during a process of forming the insulating layer 110 including a plurality of inorganic layers, a metallic pattern layer M is formed and a hole 110MH is formed in the insulating layer 110 and exposes the upper surface of the metallic pattern layer M. The hole 110MH may be formed during a process of forming the recess 310B. After that, when the pixel electrode 510 of the display area DA is patterned, while the metallic pattern layer M is etched by using etchant patterning the pixel electrode 510, the step portion 365 having the undercut shape is formed (see FIG. 12B). Next, during a process of forming the organic layers including the first functional layer 521 to the second functional layer 523 above the display area DA, the organic layers are formed also above the insulating layer 110 having the step portion 365. After that, the organic layers are removed via laser etching, and a state illustrated in FIG. 12B is obtained.

After that, the opposite electrode 530 is formed as illustrated in FIG. 12C. The opposite electrode 530 is disconnected by the undercut shape of the step portion 365. Since the opposite electrode 530 is disconnected, a lateral moisture penetration path via an interface between the opposite electrode 530 and layers adjacent thereto may be blocked.

Though FIGS. 12A to 12C illustrate a case in which the metallic pattern layer M is completely removed by etchant, an embodiment is not limited thereto. In another embodiment, a portion Ma of the edge of the metallic pattern layer M may remain during a process and form the lower portion of the step portion 365' as illustrated in FIG. 13. Even though the portion Ma of the metallic pattern M remains as illustrated in FIG. 13, a lower width W1' of the step portion 365' is less than an upper width W2' as understood by a person of ordinary skill in the art.

The pixel circuit 200 and the insulating layer 110 in FIGS. 7 to 10 may have the structures described above with reference to FIG. 4 or 5. For example, the pixel circuit 200 and the insulating layer 110 may have the structures corresponding to the embodiments described above with reference to FIG. 4 or 5, or modified embodiments thereof, and specific descriptions thereof are not repeated.

Figure 14:
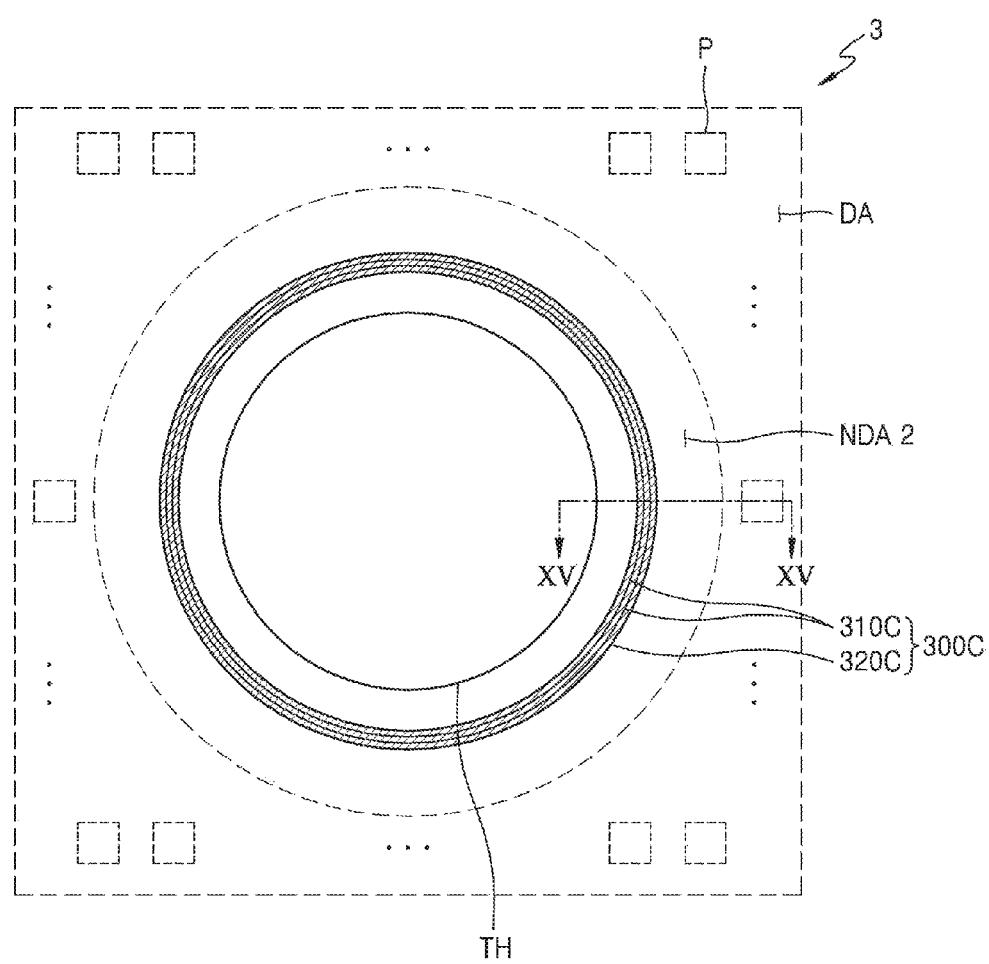
FIG. 14 is a plan view magnifying a display area around a through portion in a display device according to another embodiment.
Figure 15:
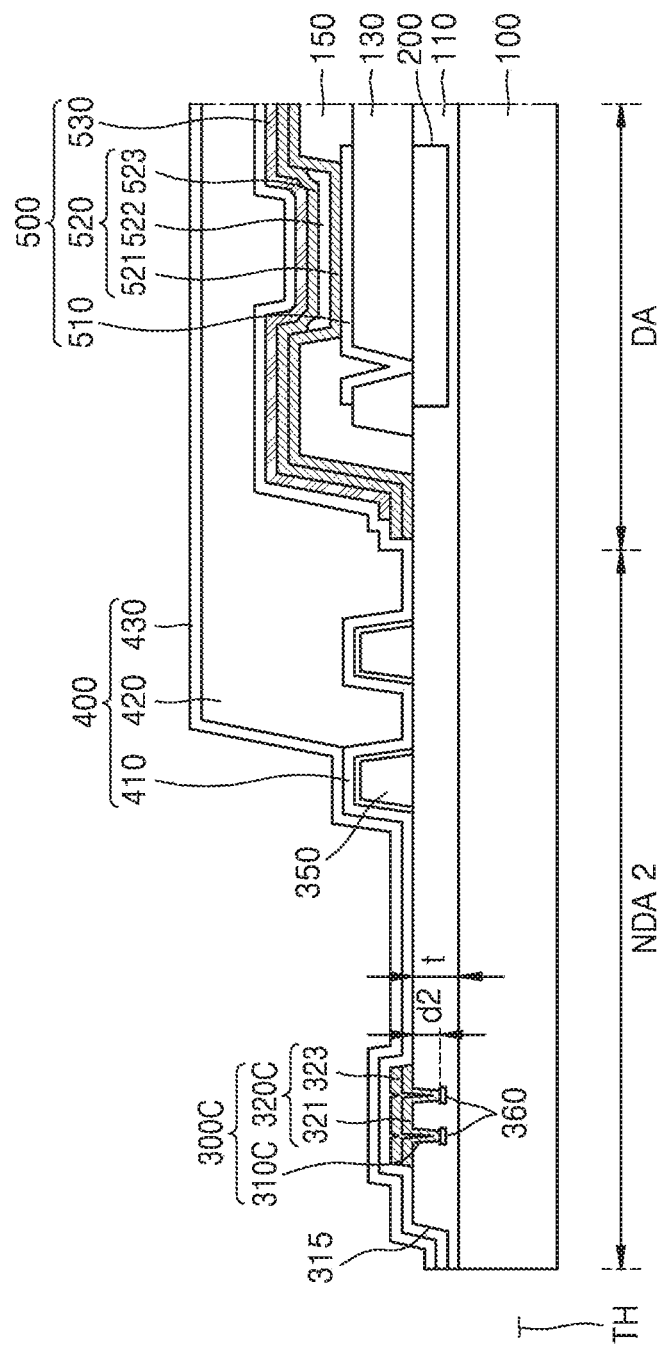
FIG. 15 is a cross-sectional view taken along a line XV-XV of FIG. 14.

FIG. 14 is a plan view magnifying a display area around a through portion in a display device 3 according to another embodiment, FIG. 15 is a cross-sectional view taken along a line XV-XV of FIG. 14, and FIGS. 16 to 18 are views illustrating a modified embodiment of FIG. 15.

Since the display device 3 illustrated in FIGS. 14 and 15 has substantially the same structure and configuration as those of the display device 1 described above with reference to FIGS. 1 and 2, differences are mainly described below.

Referring to FIGS. 14 and 15, a pattern portion 300C includes a recess 310C and a cladding layer 320C covering the recess 310C.

The recess 310C is concave along a thickness direction of the insulating layer 110 located above the substrate 100, and a depth d2 of the recess 310C is less than a thickness t of the insulating layer 110.

The cladding layer 320C overlaps the recess 310C and covers the recess 310C. The cladding layer 320C is arranged right on the insulating layer 110 including the recess 310C to directly contact the recess 310C, and a portion of the cladding layer 320C may be arranged inside the recess 310C.

In an embodiment, the cladding layer 320C may have a multi-layered structure 321 and 323 including the same materials as those of a first functional layer 521 and a second functional layer 523 as illustrated in FIG. 15. In another embodiment, the cladding layer 320C may be a single layer 321 including the same material as that of the first functional layer 521, or a single layer 323 including the same material as that of the second functional layer 523.

Figure 16:
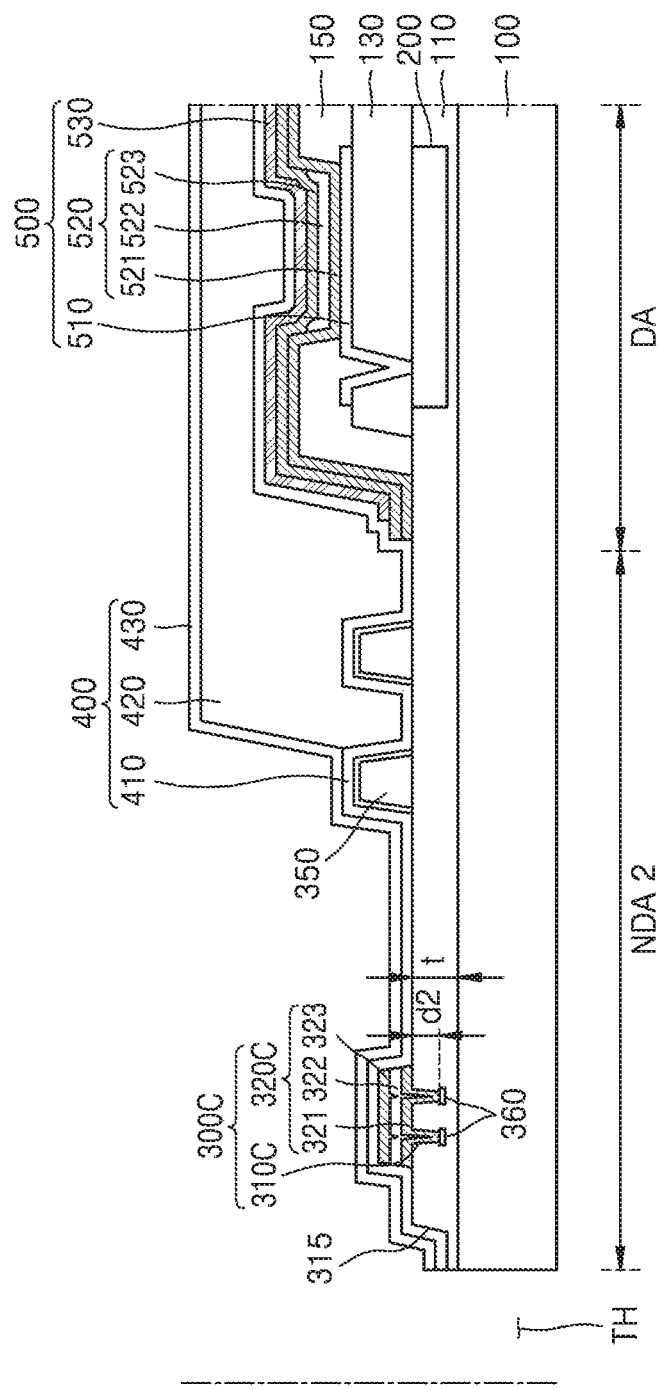
FIGS. 16, 17 and 18 are views illustrating a modified embodiment of FIG. 15.

In another embodiment, as illustrated in FIG. 16, the cladding layer 320C may further include a layer 322 having the same material as that of the emission layer 522. Alternatively, the cladding layer 320C may be a multi-layer 321 and 322 including the same material as those of the first functional layer 521 and the emission layer 522, or may be a multi-layer 322 and 323 including the same material as those of the second functional layer 523 and the emission layer 522. In another embodiment, the cladding layer 320C may be a single layer 322 including the same material as that of the emission layer 522.

For convenience of description, a case in which the cladding layer 320C has a multi-layered structure 321 and 323 including the same material as those of the first functional layer 521 and the second functional layer 523 as illustrated in FIG. 15 is described below.

The cladding layer 320C of the pattern portion 300C may be formed during a process of removing the first and second functional layers 521 and 523 formed in the second sub-non-display area NDA2 of the substrate 100. During a process of manufacturing the display device 3, the first and second functional layers 521 and 523 may be formed to cover not only the display area DA but also the second sub-non-display area NDA2 surrounding the through portion TH. A portion of these layers 521 and 523 corresponding to the second sub-non-display area NDA2 may be removed via laser etching before the encapsulation layer 400 is formed. While portions of the first and second functional layers 521 and 523 corresponding to the second sub-non-display area NDA2 are removed via laser etching, the cladding layer 320C may be formed by leaving a portion of the first and second functional layers 521 and 523 covering the recess 310C.

A metallic pattern 360 is arranged below the recess 310C and adjusts a depth d2 of the recess 310C. The upper surface of the metallic pattern 360 corresponds to the bottom of the recess 310C.

As described above with reference to FIG. 4, the recess 310C may be formed simultaneously during a process of forming contact holes for connecting the semiconductor layer 211 to the source electrode 215s and the drain electrode 215d of the TFT 210. During the etching process of forming the recess 310C, since the metallic pattern 360 performs as a function of an etching stopper, the depth d2 of the recess 310C is controlled less than the depth of the contact holes.

If the metallic pattern 360 does not exist, the depth d2 of the recess 310C deepens and a flatness of the upper surface of the pattern portion 300C may deteriorate. For example, even though the cladding layer 320C includes the layer 321 including the same material as that of the first functional layer 521 and the layer 323 including the same material as that of the second functional layer 523, the thickness of the cladding layer 320C may be less than about 3000 Å according to an embodiment. If the depth d2 of the recess 310C is greater than about 3000 Å, the cladding layer 320C is located inside the recess 310C and does not cover the recess 310C. If the recess 310C is not completely covered, a flatness of the upper surface of the pattern portion 300C deteriorates, and thus a crack generation possibility of the inorganic encapsulation layers 410 and 430 above the pattern portion 300C may increase.

However, according to an embodiment, the metallic pattern 360 is provided and adjusts the depth of the recess 310C, thereby preventing deterioration of the flatness of the pattern portion 300C. In an embodiment, the depth d2 of the recess 310C may be less than the thickness of the cladding layer 320C and may be about 3000 Å or less, but an embodiment is not limited thereto.

Figure 17:
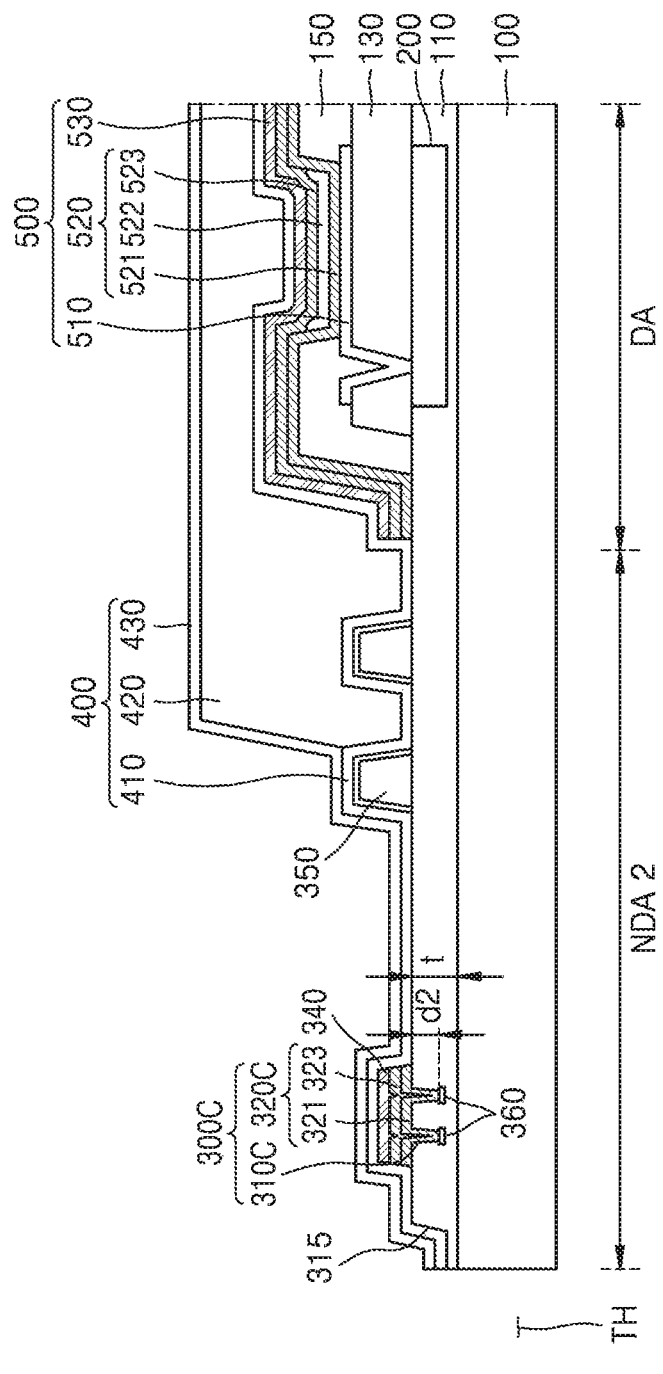

Referring to FIG. 17, a layer 340 including the same material as that of the opposite electrode 530 may be further formed above the pattern portion 300C. The layer 340 may be formed during a process of removing a portion of the opposite electrode 530 entirely formed above the substrate 100 via a laser etching process, and description thereof is the same as that described with reference to FIG. 9.

Figure 18:
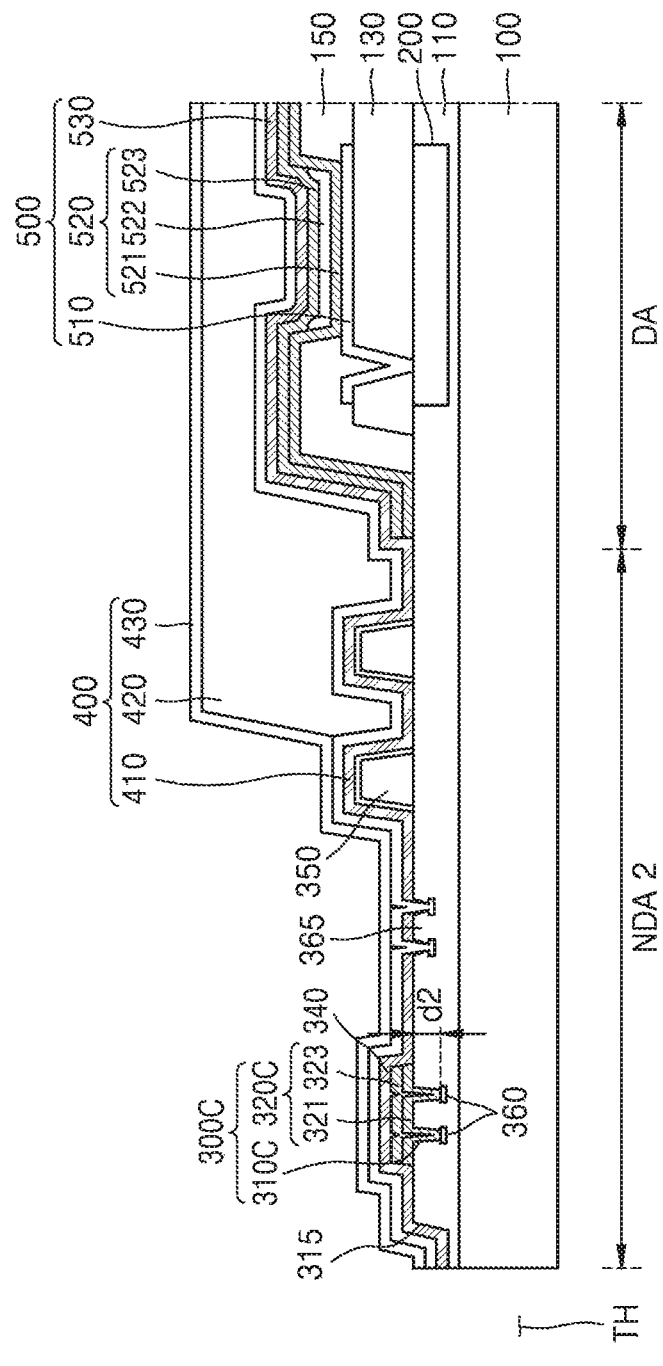

In another embodiment, the opposite electrode 530 may be formed after the laser etching process. In this case, since the process of removing the opposite electrode 530 is not required, a step portion 365 may be arranged in the second sub-non-display area NDA2 as illustrated in FIG. 18. Since the step portion 365 has an undercut shape, the step portion 365 may induce disconnection of the opposite electrode 530. The forming of the step portion 365 and the disconnection of the opposite electrode 530 by this have been described above with reference to FIGS. 10 to 13.

A pixel circuit 200 and an insulating layer 110 in FIGS. 15 to 18 may have the structures described above with reference to FIG. 4 or 5. For example, the pixel circuit 200 and the insulating layer 110 may have the structures corresponding to the embodiments described above with reference to FIG. 4 or 5, or modified embodiments thereof, and specific descriptions thereof are not repeated.

Figure 19:
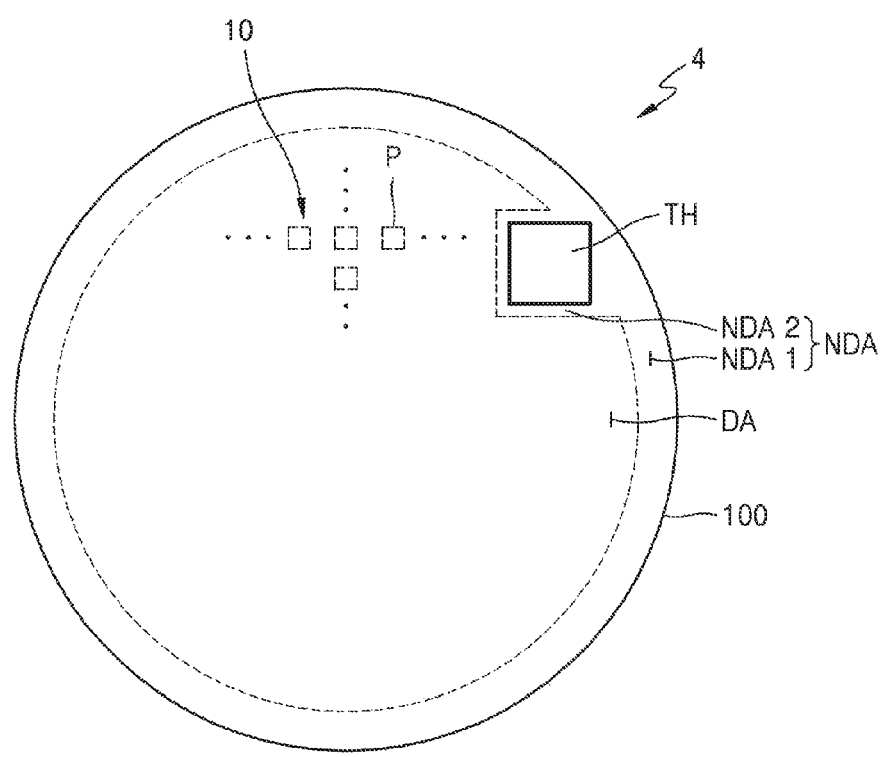
FIG. 19 is a plan view illustrating a display device according to another embodiment.
Figure 20:
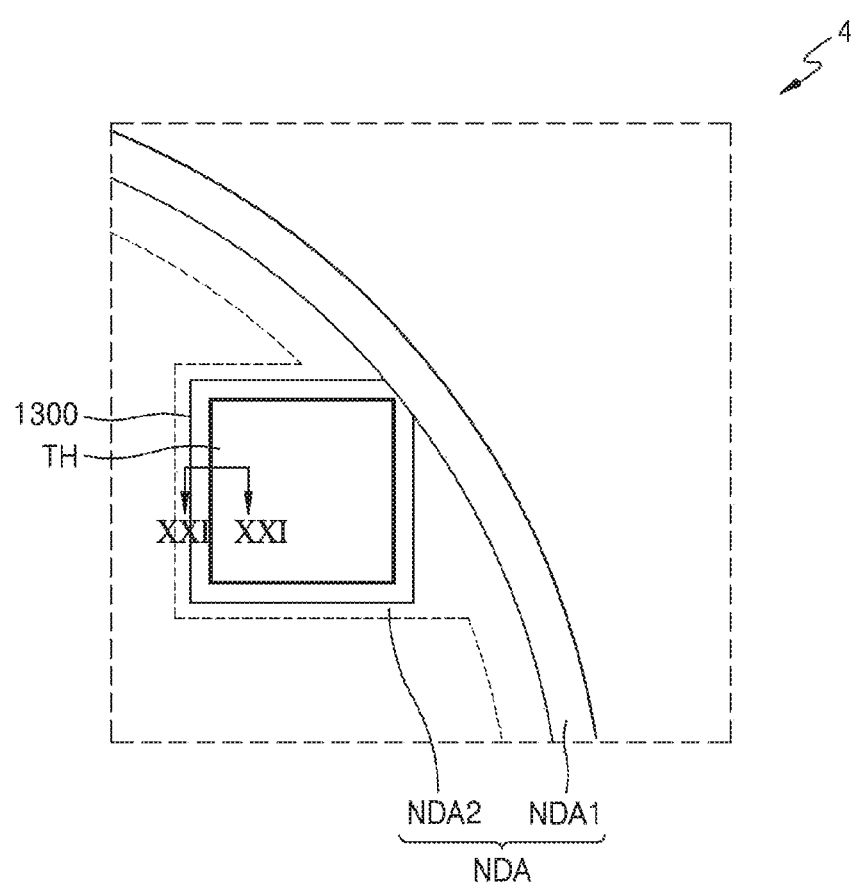
FIG. 20 is a partial plan view illustrating surroundings of a through portion of FIG. 19.

FIG. 19 is a plan view illustrating a display device 4 according to another embodiment, FIG. 20 is a plan view extracting surroundings of a through portion of FIG. 19, and FIGS. 21A to 21G are cross-sectional views taken along a line XXI-XXI of FIG. 20 according to an embodiment.

Referring to FIGS. 19 and 20, the display device 4 is the same as the display device described above with reference to FIG. 1 except that a pixel array 10 partially surrounds a through portion TH. The same points are omitted, and differences are mainly described below.

According to an embodiment, since pixels P of the display device 4 partially surround the through portion TH, a first sub-non-display area NDA1 surrounding the outer edge of the display area DA may be connected to a second sub-non-display area NDA2 partially surrounding the outer edge of the through portion TH.

The display device 4 includes a pattern portion 1300 surrounding the through portion TH. The pattern portion 1300 may have a structure illustrated in FIGS. 21A to 21G.

Figure 21A:
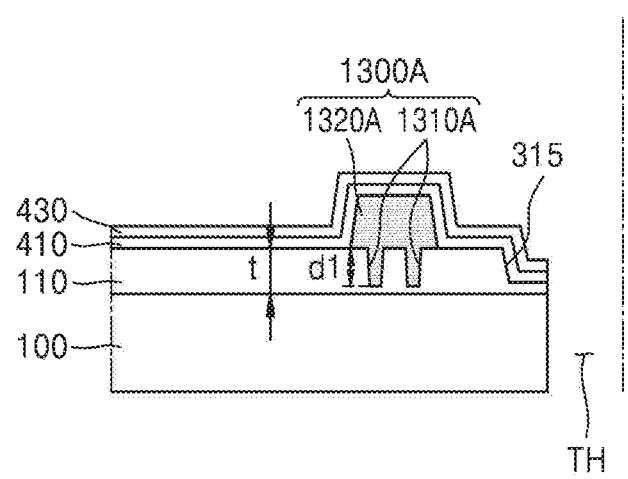
FIGS. 21A, 21B, 21C, 21D, 21E, 21F and 21G are cross-sectional views taken along a line XXI-XXI of FIG. 20 according to an embodiment.

In an embodiment, as illustrated in FIG. 21A, a pattern portion 1300A includes a recess 1310A concave along a thickness direction of the insulating layer 110 and a cladding layer 1320A covering the recess 1310A. Since the structure of the pattern portion 1300A including the recess 1310A and the cladding layer 1320A is the same as that described above with reference to FIGS. 3 to 5, repeated description is omitted.

Figure 21B:
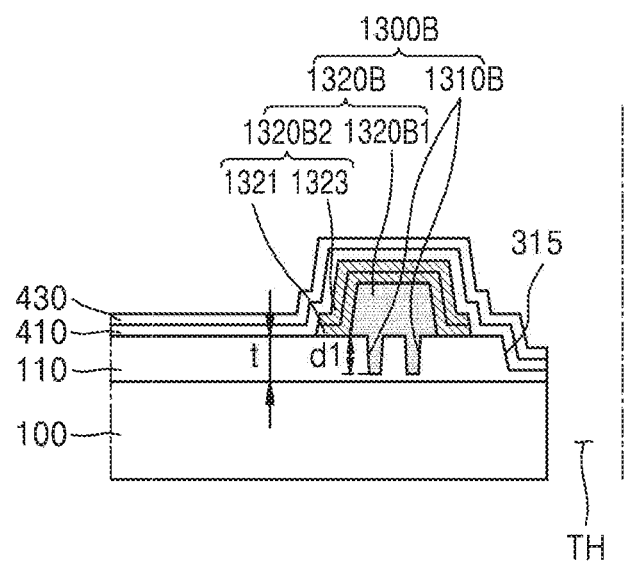
Figure 21C:
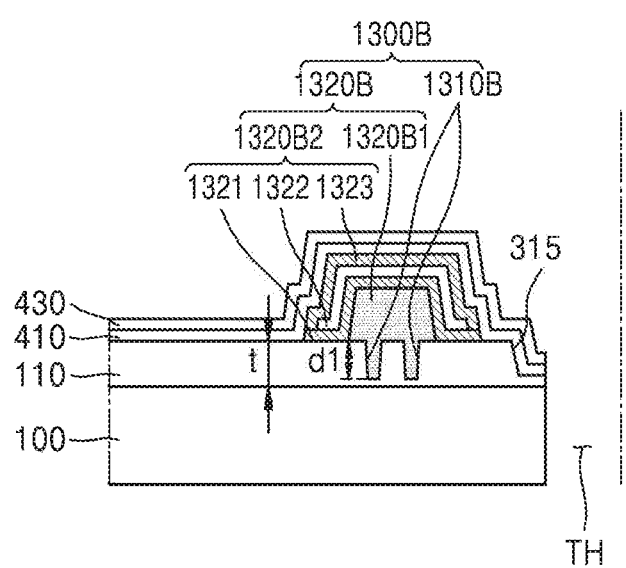
Figure 21D:
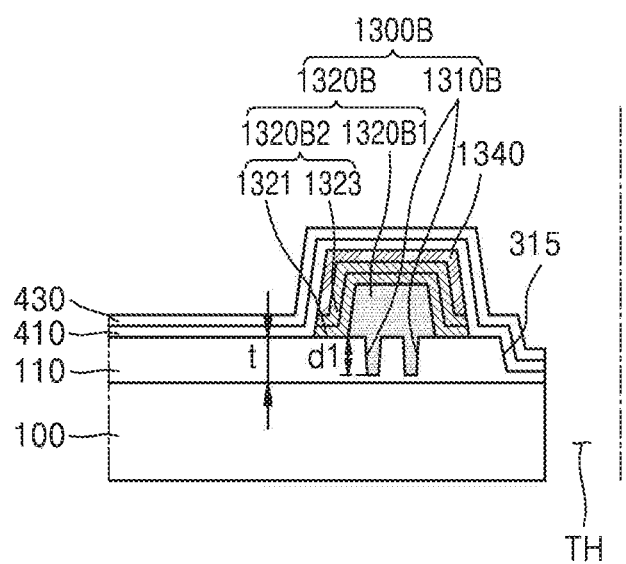

In another embodiment, as illustrated in FIGS. 21B to 21D, a pattern portion 13006 includes a recess 1310B concave along a thickness direction of the insulating layer 110 and a cladding layer 1320B covering the recess 1310B. The cladding layer 1320B includes a first material layer 1320B1 and a second material layer 1320B2. The first material layer 1320B1 is the same as the first material layer 320B1 described above with reference to FIGS. 7 to 9.

As illustrated in FIG. 21B, the second material layer 1320B2 may have a multi-layered structure 1321 and 1323 including same materials as those of the first functional layer 521 (see FIGS. 7 to 9) and the second functional layer 523 (see FIGS. 7 to 9) of the organic light-emitting diode (OLED) provided to a pixel.

Alternatively, as illustrated in FIG. 21C, the second material layer 1320B2 may have a multi-layered structure 1321, 1322, and 1323 further including the same material as that of the emission layer 522 (see FIGS. 7 to 9). As illustrated in FIG. 21D, the second material layer 1320B2 may be covered with a layer 1340 including the same material as that of the opposite electrode 530 (see FIGS. 9 and 10). The number of stacking of the second material layer 1320B2 is not limited to the above embodiment and may change variously. For example, the second material layer 1320B2 may have a multi-layered or single-layered structure depending on the number of cases of the first functional layer, the emission layer, and the second functional layer, and specific descriptions thereof are the same as those described above with reference to FIGS. 7 to 9.

Figure 21E:
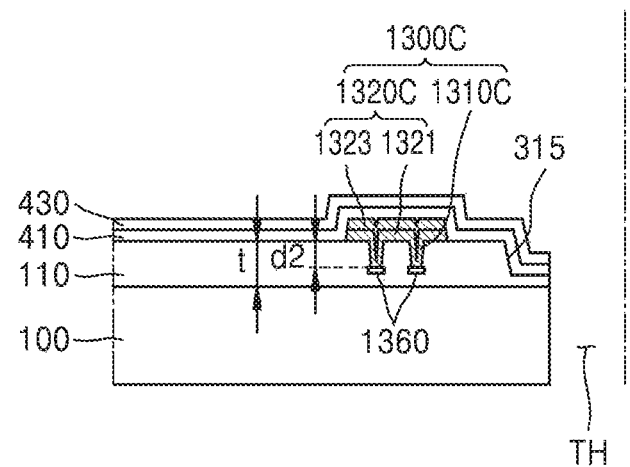
Figure 21F:
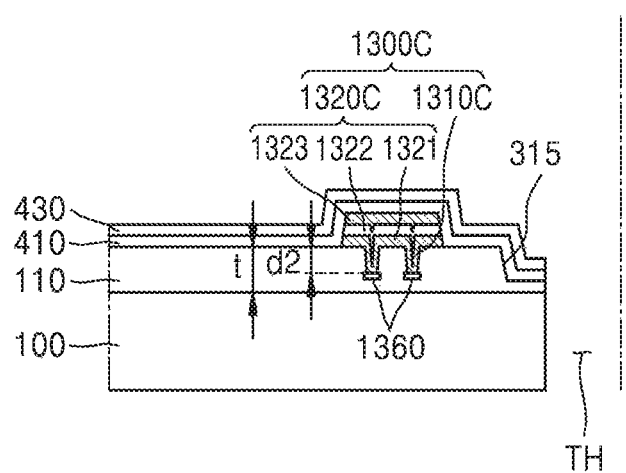
Figure 21G:
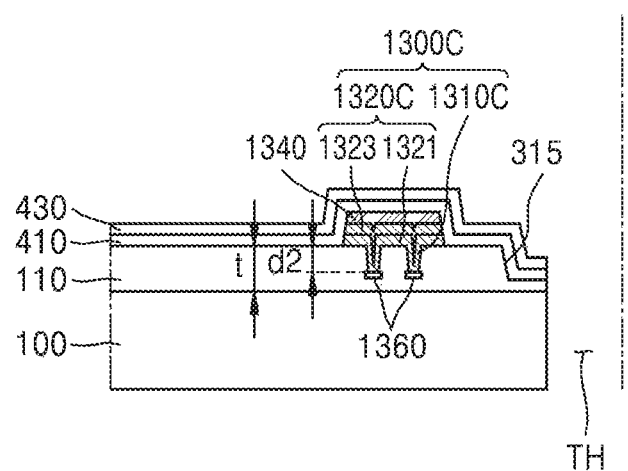

In another embodiment, as illustrated in FIGS. 21E to 21G, a pattern portion 1300C includes a recess 1310C concave along a thickness direction of the insulating layer 110 and a cladding layer 1320C covering the recess 1310C. A metallic pattern 1360 may be provided below the recess 1310C and may control a depth d2 of the recess 1310C.

The cladding layer 1320C may have a multi-layered or single-layered structure. The cladding layer 1320C is not limited to the stacked structure illustrated in FIGS. 21E to 21G and may have a multi-layered or single-layered structure depending on the number of cases of the first functional layer, the emission layer, and the second functional layer, and specific descriptions thereof are the same as those described above with reference to FIGS. 15 to 17.

Figure 22:
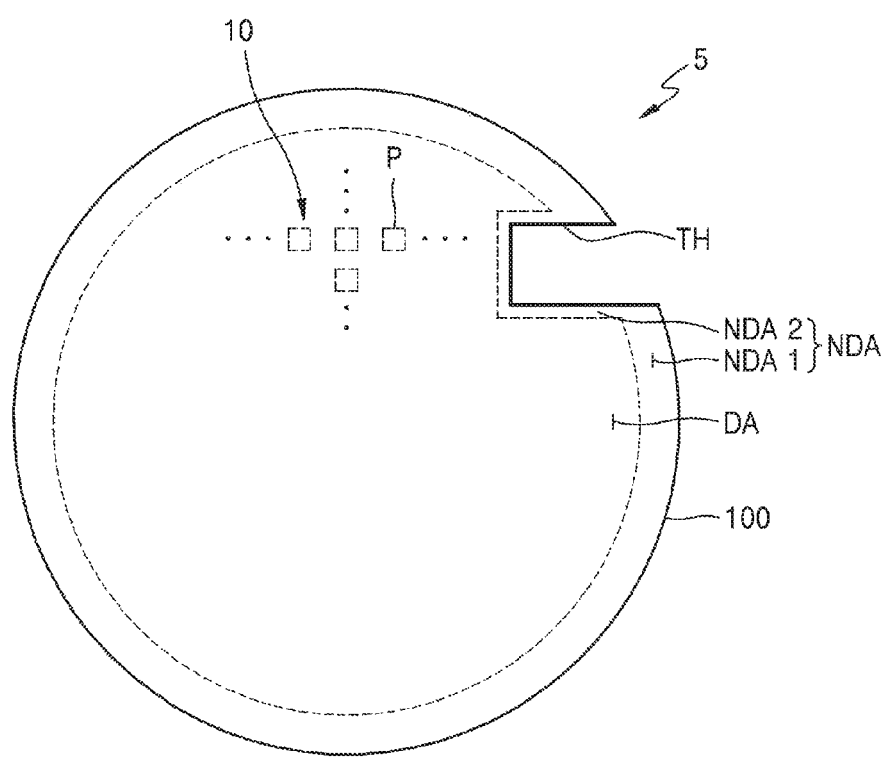
FIG. 22 is a plan view illustrating a display device according to another embodiment.
Figure 23:
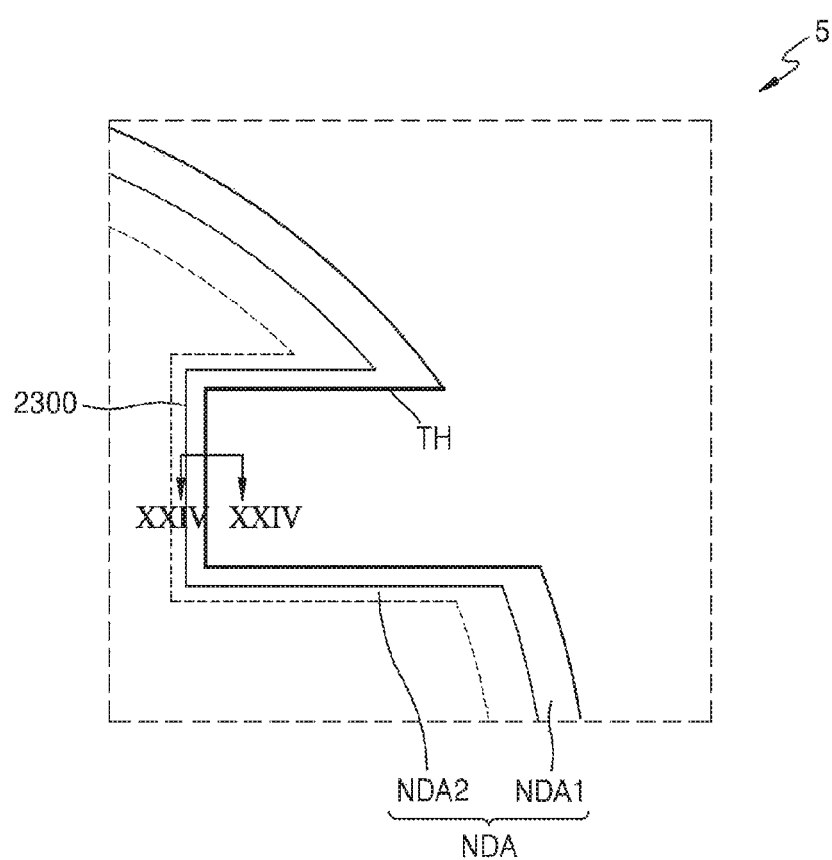
FIG. 23 is a partial plan view illustrating surroundings of a through portion of FIG. 22.

FIG. 22 is a plan view illustrating a display device 5 according to another embodiment, FIG. 23 is a plan view extracting surroundings of a through portion of FIG. 22, and FIGS. 24A to 24F are cross-sectional views taken along a line XXIV-XXIV of FIG. 22 according to an embodiment.

Referring to FIGS. 22 and 23, the display device 5 is the same as the display device described above with reference to FIG. 1 except that a pixel array 10 partially surrounds a through portion TH and the through portion TH is not the single closed curve described above with reference to FIGS. 1 and 19 but extends up to the edge of the display device 5. Hereinafter, the same points are omitted, and differences are mainly described.

According to an embodiment, since the pixels P of the display device 5 partially surround the through portion TH, a first sub-non-display area NDA1 surrounding the outer edge of the display area DA may be connected to a second sub-non-display area NDA2 partially surrounding the outer edge of the through portion TH.

The display device 5 includes a pattern portion 2300 partially surrounding the through portion TH. The pattern portion 2300 may have a structure illustrated in FIGS. 24A to 24F.

Figure 24A:
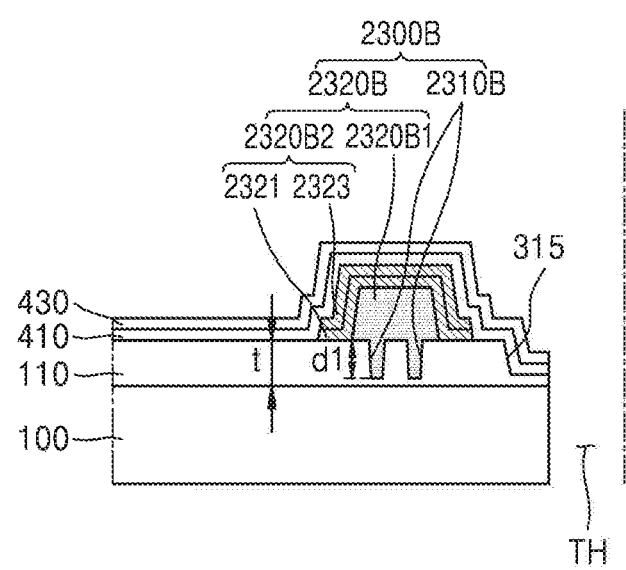
FIGS. 24A, 24B, 24C, 24D, 24E and 24F are cross-sectional views taken along a line XXIV-XXIV of FIG. 22 according to an embodiment.
Figure 24B:
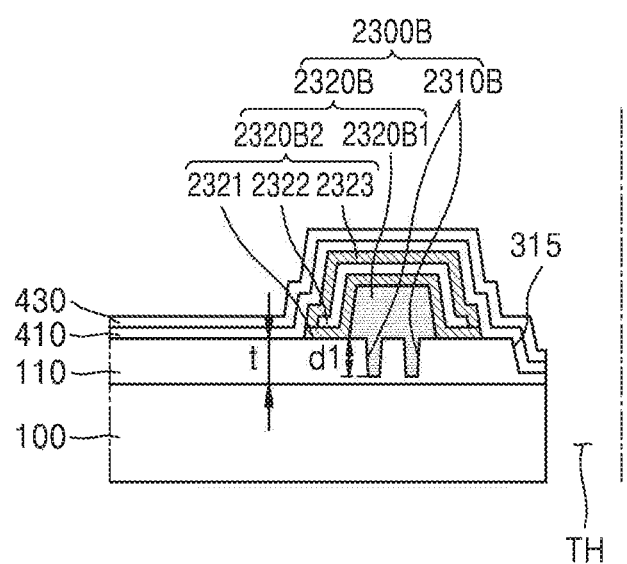
Figure 24C:
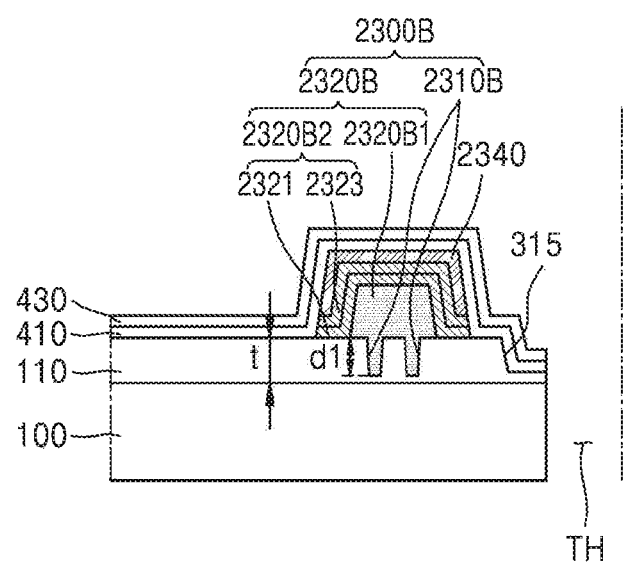

In an embodiment, as illustrated in FIGS. 24A to 24C, a pattern portion 2300B includes a recess 2310B concave along a thickness direction of the insulating layer 110 and a cladding layer 2320B covering the recess 2310B. The cladding layer 2320B includes a first material layer 2320B1 and a second material layer 2320B2. The first material layer 2320B1 is the same as the first material layer 320B1 described above with reference to FIGS. 7 to 9.

As illustrated in FIG. 24A, the second material layer 2320B2 may have a multi-layered structure 2321 and 2323 including the same materials as those of the first functional layer 521 (see FIGS. 7 to 9) and the second functional layer 523 (see FIGS. 7 to 9) of an OLED provided to a pixel.

Alternatively, as illustrated in FIG. 24B, the second material layer 2320B2 may be a multi-layer 2321, 2322, 2323 further including the same material as that of the emission layer 522 (see FIGS. 7 to 9). As illustrated in FIG. 24C, the second material layer 2320B2 may be covered with a layer 2340 including the same material as that of the opposite electrode 530 (see FIGS. 9 and 10). The number of stacking of the second material layer 2320B2 is not limited to the above-described embodiment and may change variously. For example, the second material layer 2320B2 may have a multi-layered or single-layered structure depending on the number of cases of the first functional layer, the emission layer, and the second functional layer, and specific descriptions thereof are the same as those described above with reference to FIGS. 7 to 9.

Figure 24D:
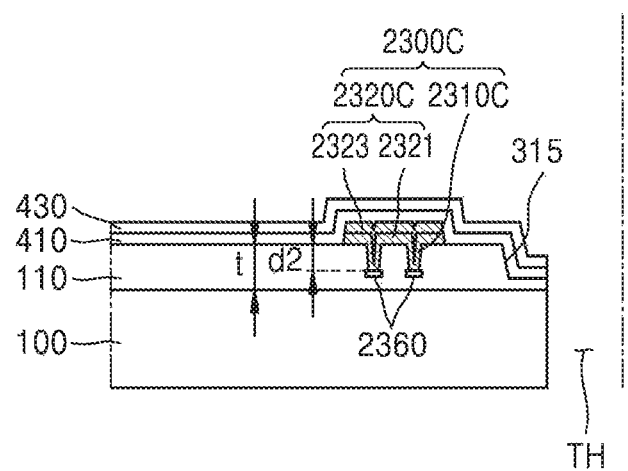
Figure 24E:
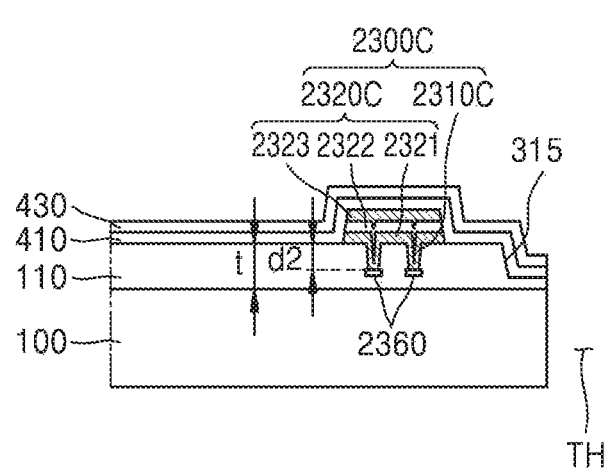
Figure 24F:
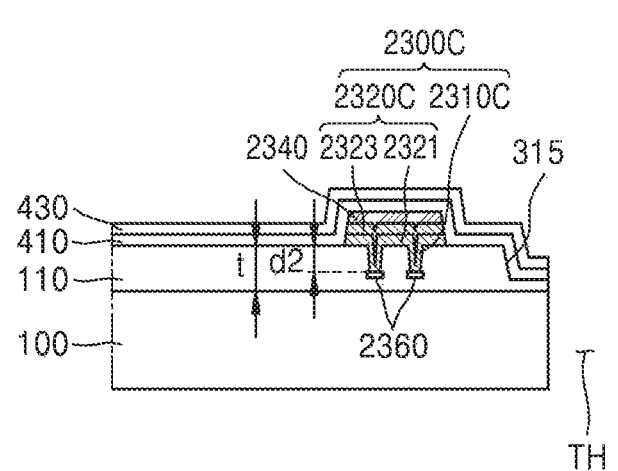

In another embodiment, as illustrated in FIGS. 24D to 24F, a pattern portion 2300C includes a recess 2310C concave along a thickness direction of the insulating layer 110 and a cladding layer 2320C covering the recess 2310C. A metallic pattern 2360 may be provided below the recess 2310C and may control a depth d2 of the recess 2310C.

The cladding layer 2320C may have a multi-layered or single-layered structure. The cladding layer 2320C is not limited to the stacked structure illustrated in FIGS. 24D to 24F and may have a multi-layered or single-layered structure depending on the number of cases of the first functional layer, the emission layer, and the second functional layer, and the specific descriptions thereof are the same as those described above with reference to FIGS. 15 to 17.

Though the inventive concept has been described with reference to the embodiments illustrated in the drawings, but this is merely exemplary and it will be understood by those of ordinary skill in the art that various changes in form and details may be made therein without departing from the spirit and scope of the inventive concept as defined by the following claims.

What is claimed is:

1. A display device comprising:
   a substrate;
   an insulating layer arranged above the substrate;
   a through portion configured to pass through the substrate and the insulating layer;
   a pixel array located above the insulating layer and comprising pixels each comprising a light-emitting element comprising a pixel electrode, an opposite electrode facing the pixel electrode, and an emission layer arranged between the pixel electrode and the opposite electrode, the pixels at least partially surrounding the through portion; and
   a pattern portion arranged between the through portion and the pixel array,
   wherein the pattern portion comprises:
   a recess that is concave along a thickness direction of the insulating layer; and
   a cladding layer arranged above the insulating layer, configured to cover the recess, and comprising a material different from the insulating layer.

2. The display device of claim 1, wherein the substrate comprises a display area in which the pixel array is located and a non-display area adjacent to the display area, and
   the non-display area comprises a first sub-non-display area at least partially surrounding an outer edge of the display area and a second sub-non-display area at least partially surrounding an outer edge of the through portion between the through portion and the display area.

3. The display device of claim 2, wherein the pattern portion is arranged in the second sub-non-display area.

4. The display device of claim 1, wherein the insulating layer comprises an inorganic layer.

5. The display device of claim 4, further comprising a pixel circuit comprising a thin film transistor and a storage capacitor, and wherein the insulating layer comprises a plurality of inorganic insulating layers, and at least one of the plurality of inorganic insulating layers is arranged between electrodes of the thin film transistor or between electrodes of the storage capacitor to insulate the electrodes.

6. The display device of claim 1, wherein the recess has a depth less than or corresponding to a thickness of the insulating layer.

7. The display device of claim 1, wherein the cladding layer comprises an organic material.

8. The display device of claim 1, wherein the light-emitting element further comprises at least one of a first functional layer arranged between the pixel electrode and the emission layer and a second functional layer arranged between the emission layer and the opposite electrode,
the cladding layer comprises at least one of a first material layer and a second material layer,
the first material layer comprises an insulating material, and
the second material layer comprises a same material as at least one of the at least one functional layer and the emission layer.

9. The display device of claim 8, wherein the cladding layer comprises the first material layer, and
a portion of the first material layer is located inside the recess.

10. The display device of claim 8, wherein the cladding layer comprises the second material layer, and
a portion of the second material layer is located inside the recess.

11. The display device of claim 10, further comprising:
a metallic pattern located below the recess, an upper surface of the metallic pattern corresponding to a bottom surface of the recess.

12. The display device of claim 8, wherein the cladding layer comprises a stacked body comprising the first material layer and the second material layer arranged above the first material layer.

13. The display device of claim 1, wherein the through portion comprises a single closed curve.

14. The display device of claim 13, wherein the recess has a ring shape surrounding the through portion and having a diameter greater than a diameter of the through portion.

15. The display device of claim 1, wherein the through portion extends up to at least one edge of the display device.

16. The display device of claim 1, further comprising:
a layer arranged above the cladding layer and comprising a same material as that of the opposite electrode.

17. The display device of claim 1, further comprising:
an encapsulation layer configured to cover the pixel array.

18. The display device of claim 17, wherein the encapsulation layer comprises an inorganic encapsulation layer and an organic encapsulation layer.

19. The display device of claim 18, further comprising:
a dam arranged between the pattern portion and the pixel array,
an end of the organic encapsulation layer being located between the dam and the pixel array.

20. The display device of claim 18, wherein the inorganic encapsulation layer extends toward the through portion and covers the pattern portion.

21. The display device of claim 20, wherein the inorganic encapsulation layer directly contacts the insulating layer in a region between the through portion and the pattern portion.

22. The display device of claim 1, wherein the insulating layer comprises an auxiliary recess corresponding to a region between the through portion and the pattern portion.

23. The display device of claim 1, further comprising:
a step portion having an undercut shape and arranged between the through portion and the pixel array.

24. The display device of claim 23, wherein the opposite electrode extends toward the through portion and is disconnected by the step portion.

* * * * *